(12) United States Patent
Yang et al.

(10) Patent No.: US 7,796,320 B2
(45) Date of Patent: Sep. 14, 2010

(54) STACKED LAYER ELECTRODE FOR ORGANIC ELECTRONIC DEVICES

(75) Inventors: Yang Yang, Los Angeles, CA (US); Hsing-En Elbert Wu, Santa Monica, CA (US)

(73) Assignee: The Regents of the University of California, Oakland, CA (US)

( * ) Notice: Subject to any disclaimer, the term of this patent is extended or adjusted under 35 U.S.C. 154(b) by 647 days.

(21) Appl. No.: 11/664,701

(22) PCT Filed: Oct. 24, 2005

(86) PCT No.: PCT/US2005/038137

§ 371 (c)(1), (2), (4) Date: Apr. 5, 2007

(87) PCT Pub. No.: WO2007/001429

PCT Pub. Date: Jan. 4, 2007

(65) Prior Publication Data

US 2008/0029147 A1 Feb. 7, 2008

Related U.S. Application Data

(60) Provisional application No. 60/621,705, filed on Oct. 25, 2004.

(51) Int. Cl.
*G02F 1/03* (2006.01)
(52) U.S. Cl. .................................................... 359/245
(58) Field of Classification Search ................. 359/245, 359/248, 254, 237; 257/38, 39, 431, 464
See application file for complete search history.

(56) References Cited

U.S. PATENT DOCUMENTS

| 5,049,780 | A | 9/1991 | Dobrowolski et al. |
| 5,986,401 | A | 11/1999 | Thompson et al. |
| 6,011,277 | A | 1/2000 | Yamazaki |
| 6,452,270 | B1* | 9/2002 | Huang .................... 257/738 |
| 6,858,271 | B1 | 2/2005 | Okada et al. |
| 7,544,884 | B2* | 6/2009 | Hollars .................... 136/256 |

OTHER PUBLICATIONS

Written Opinion of the International Searching Authority (PCT/ISA/237) mailed Feb. 6, 2008.
Notification of Transmittal of the International Search Report and the Written Opinion of the International Searching Authority, or the Declaration (PCT/ISA/220) mailed Feb. 6, 2008.

(Continued)

*Primary Examiner*—Timothy J Thompson
*Assistant Examiner*—Tuyen Q Tra
(74) *Attorney, Agent, or Firm*—Venable LLP; Henry J. Daley

(57) ABSTRACT

An electrode for an electro-optic device has a wetting layer of electrically conductive material formed on a substrate. A second layer of electrically conductive material is formed on the wetting layer of electrically conductive material. The wetting layer has a first wetting ability with respect to a surface of the substrate and the second layer has a second wetting ability with respect to the surface of said substrate. The first wetting ability is different from the second wetting ability and the wetting layer acts to alter an optical property of the electrode due to the wetting ability of the wetting layer on the surface of the substrate.

39 Claims, 18 Drawing Sheets

OTHER PUBLICATIONS

J.H. Burroughes, D.D.C. Bradley, A.R. Brown, R.N. Marks, K. Mackey, and R. H. Friend, Nature, 347, 539, (1990).

C.N. King, Inorganic and Organic Electroluminescence, edited by R. H. Mauch and H.-E Gumlich (Wissenchaft & Technik Verlag, Berlin, 1996), p. 375).

A. Yamamori, S. Hayashi, T. Koyama, and Y. Taniguchi, Appl. Phys. Letts, 78, 3343 (2001)).

G. Gu, V. Bulovic, P.E. Burrows, S. R. Forrest, and M. E. Thompson, Appl. Phys. Letts, 68, 2606 (1996).

L.S. Hung and C. W. Tang, Appl. Phys. Letts, 74, 3209 (1999).

G. Pathasarathy, P. E. Burrows, V. Khalfin, V. G. Kozolov, and S. R. Forrest, Appl. Phys. Letts, 72, 2138 (1998).

V. Bulovic, P. Tian, P.E. Burrows, M. R. Gokhale, S. R. Forrest, and M. E. Thompson, Appl. Phys. Letts, 70, 1954 (1997).

H. Kim, C. M. Gilmore, J. S. Horwitz, A. Pique, H. Murata, G. P. Kushto, R. Schlaf, Z. H. Kafafi, and D. B. Crisey, Appl. Phys. Lett. 76, 259, (2000).

C.W. Tang and S.A. Vanslyke, Appl. Phys. Lett. 51, 913, (1987).

L.S. Hung, C. W. Tang, M. G. Mason, P. Raychaudhuri, and J. Madathil, Appl. Phys. Letts, 78, 544 (2000).

R. B. Pode, C. J. Lee, D. G. Moon, and J. I. Han, Appl. Phys. Lett. 84, 4614, (2004).

P.W. Gilberd, J. Phys. F: Met. Phys., 12, 1845, (1982).

Q. Xu, J. Ouyang, Y. Yang, Appl. Phys. Lett. 83, 4695, (2003).

R. A. Chipman, Theory and Problems of Transmission Lines (Schaum Outline Series 1968) p. 78 & 85.

M. Stossel, J. Staudigel, F. Steuber, J. Simmerer, and A. Winnacker, Appl. Phys. A: Mater. Sci. Process. 68, 387 (1999).

L. S. Hung, C. W. Tang, and M. G. Mason, Appl. Phys. Lett. 70, 152, (1997).

L.S. Hung, M. G. Mason, EL000 47, (2000).

F. L. Wong, M. K. Fung, X. Jiang, C. S. Lee, Thin Solid Films 446, 14, (2004).

J. Ivanco, B. Winter, F. P. Netzer, and M. G. Ramsey, Appl. Phys. Letts. 85, 585, (2004).

S. Han, D. Grozea, C. Huang, and Z. H. Lu, J. Appl. Phys. 96, 709, (2004).

B. Abeles, P. Sheng, M. D. Coutts, and Y. Arie, Adv. Phys. 24, 407, (1975).

T. Holstein, Phys. Rev. 88, 1427, (1952).

B. Abeles, RCA Rev. 36, 594, (1975).

M. Hiramoto, M. Suezaki, and M. Yokoyama, Chem. Lett. 1990, 327 (1990).

A. Yakimov and S. R. Forrest, Appl. Phys. Lett. 80, 1667 (2002).

L. P. Ma, J. Liu, and Y. Yang, Appl. Phys. Lett. 80, 2997 (2002).

R.S. Potember, T.O. Poehler, and D.O. Cowman, Appl. Phys. Lett. 34, 405, (1979).

J. van den Brand, P.C. Snijders, W.G. Sloof, H. Terryn, and J. H. E. de Wit, J. Phys. Chem. B, 108, 6017, (2004).

L.P. Ma, S. M. Pyo, J. Y. Ouyang, Q. F. Xu, and Y. Yang, Appl. Phys. Lett. 82, 1419, (2003).

A. Bandyopadhyay, and A. J. Pal, Appl. Phys. Lett. 84, 999, (2004).

W. Xu, G.R. Chen, R.J. Li, and Z.Y. Hua, Appl. Lett. 67, 2241, (1995).

L.P. Ma, U.J. Yang, Z.Q. Xue, and S.J. Pang, Appl. Phys. Lett. 73, 850, (1998).

H.K. Henish, and W.R. Smith, Appl. Phys. Lett. 24, 589, (1974).

M.R. Bryce, Adv. Mat. 11, 11, (1999).

N. Martý'n; L. Sa'nchez, M.A. Herranz, and D.M. Guldi, J. Phys. Chem. A 104, 4648, (2000).

\* cited by examiner

| STRUCTURE OF PLED | AFM IMAGES | AFM ROUGHNESS (nm) | RESISTIVITY (OHM/ SQUARED) |
|---|---|---|---|
| Au (0.25nm) / M(acac)$_2$ / ORGANIC LAYER / ITO/GLASS | | ~2.5nm | 18.1 |
| Al (2nm) / Au (0.25nm) / M(acac)$_2$ / ORGANIC LAYER / ITO/GLASS | | ~1.159nm | 13.15 |
| Al (2nm) / Au (9nm) / Au (0.25nm) / M(acac)$_2$ / ORGANIC LAYER / ITO/GLASS | | ~0.941nm | 10 |

FIG. 5

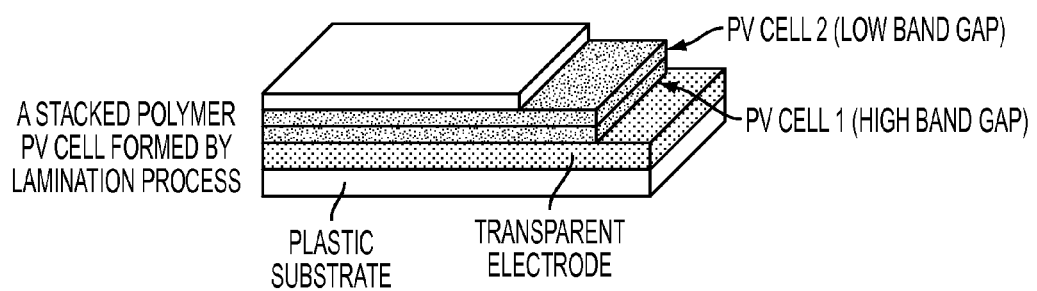
FIG. 14a
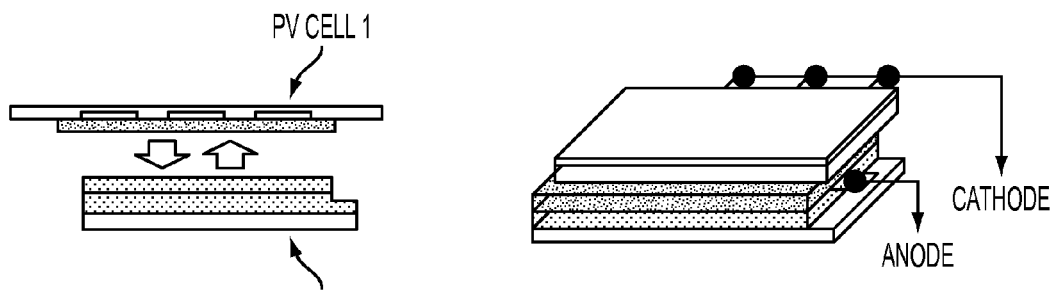
FIG. 14b
FIG. 14c

PV1 = ITO/PEDOT:PSS/MEH-PPV:PCBM/Ca/Al
PV2 = ITO/PEDOT:PSS/MEH-PPV:PCBM/Ca/Au

PV1 = ITO/PEDOT:PSS/MEH-PPV:PCBM/Ca/Al
PV2 = ITO/PEDOT:PSS/MEH-PPV:PCBM/Ca/Au

• 65% TRANSPARENT THROUGHOUT THE VISIBLE SPECTRUM

STACKED LAYER ELECTRODE FOR ORGANIC ELECTRONIC DEVICES

CROSS-REFERENCE OF RELATED APPLICATION

This application claims priority to U.S. Provisional Application No. 60/621,705 filed Oct. 25, 2004, the entire contents of which are hereby incorporated by reference.

This invention was made with Government support of Grant No. F49620-03-1-0101 awarded by the Air Force Office of Scientific Research and of Grant No. N00014-04-1-434, awarded by the Office of Naval Research. The government has certain rights in this invention.

BACKGROUND

The present invention relates to stacked electrodes for electro-optic devices, devices having such electrodes and methods of manufacture and use.

SUMMARY

Further objectives and advantages will become apparent from a consideration of the description, drawings, and examples.

An electrode for an electro-optic device has a wetting layer of electrically conductive material formed on a substrate. A second layer of electrically conductive material is formed on the wetting layer of electrically conductive material. The wetting layer has a first wetting ability with respect to a surface of the substrate and a second layer has a second wetting ability with respect to the surface of the substrate. The first wetting ability is different from the second wetting ability and the wetting layer acts to alter an optical property of the electrode due to its wetting ability on the surface of the substrate. Electro-optic devices according to this invention include, but are not limited to, polymeric light-emitting displays (PLEDs), solar cells, logic and memory devices that have electrodes according to this invention. A method of forming a stacked electrode includes depositing a first layer of a first electrically conductive material onto a substrate at a first preselected deposition rate; and depositing a second layer of a second electrically conductive material onto the first layer at a second preselected deposition rate. The first and second deposition rates are selected to obtain an optical property of the stacked electrode in addition to maintaining an electrical conductivity of the stacked electrode.

BRIEF DESCRIPTION OF THE DRAWINGS

The invention may be better understood by reading the following detailed description with reference to the accompanying figures in which:

In FIG. 2a, Au (9 nm) vs. Al (2 nm)/Au (9 nm) vs. Au (0.25 nm)/Al (2 nm)/Au (9 nm) are shown. In FIG. 2b, Cu (8 nm) vs. Cu (0.25 nm)/Al (3 nm)/Cu (8 nm) are shown. ITO is set as 100% transparency in this figure.

FIG. 5 shows images of atomic force microscopy on the Au surface with [Ba(acac)$_2$] underneath (first row), Al and [Ba(acac)$_2$] underneath (second row), and complete cathode structure Au/Al/Au (bottom row). All the image sizes are 2 μm square.

FIG. 14a shows a stacked photovoltaic device utilizing materials with different band gaps, allowing high $V_{OC}$ and $J_{SC}$ for very high efficiency.

FIGS. 14b and 14c show the formation process and schematic structure of a laminated stacked polymer PV cell.

FIG. 20b shows the I-V curves of the PVOBD of FIG. 20a.

FIGS. 21a and 21b show I-V curves before and after irradiation and current during irradiation cycle, respectively, for an optical induced memory device according to an embodiment of the current invention illustrated schematically in the inset in FIG. 21a.

DETAILED DESCRIPTION

Figure 1A:
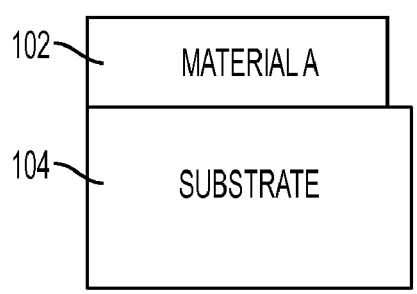
FIGS. 1a, 1b, 1c and 1d help describe some concepts of the current invention.

In describing embodiments of the present invention illustrated in the drawings, specific terminology is employed for the sake of clarity. However, the invention is not intended to be limited to the specific terminology so selected. It is to be understood that each specific element includes all technical equivalents which operate in a similar manner to accomplish a similar purpose.

Multilayered stacked electrodes according to embodiments of this invention have been fabricated for organic and polymeric electronic devices. This layered electrode structure can be composed of two or more layers of materials. The electrical conductivity and optical properties, e.g., optical transparency, reflectivity, and absorption, of the electrode can be precisely controlled by the materials used, the layering sequence, and/or the deposition rates.

These electrodes can be utilized for applications including but not limited to polymer and organic light-emitting devices, solar cells, memory devices, transistors, electrochromic devices, liquid crystal displays, sensors, capacitors, inductors, resistors, actuators, piezoelectric devices, motors, heaters, coolers, mirrors, organic or inorganic emissive displays, and combinations of these devices. In addition, these electrodes can also be useful for multi-stacking or tandem polymer and organic light-emitting devices, solar cells, memory devices, transistors, electrochromic devices, liquid crystal displays, sensors, capacitors, inductors, resistors, actuators, piezoelectric devices, motors, heaters, coolers, mirrors, organic or inorganic emissive displays, and combinations of these devices.

Several deposition methods can be applied to fabricate the electrodes according to the current invention. These methods include, but are not limited to, thermal evaporation, e-beam evaporation, sputtering, MBE, CVD, plasma-enhanced deposition, spin-coating, dip-coating, electro plating, electroless plating, organic vapor jet printing, and ink-jet printing.

The materials used in the stacking structure may include metallic materials, conductive oxides, conductive organic materials, conductive polymers, and conductive ionic materials. The interfacial layer may include, $M(acetylacetonate)_x$, salts, oxides, metallic materials, polymers, organic molecules, fibers, and/or ceramics.

The thicknesses of each material layer can be optimized depending on the desired requirements for the electronic device. In general, if the material is not optically transparent, the thicknesses of each layer of the multilayer film are constructed to be less than their individual skin depths.

The term "substrate," as used herein, may include any structure upon which a stacked electrode is formed. It may refer to a simple substrate such as glass or ITO/glass, or may refer to complex structures including electrically and/or optically active components in other cases.

By choosing materials with different wetting abilities (surface energies) to the substrate and different wetting ability between each layer, the morphology of any given deposited layer (or layers) will be significantly affected by a previously deposited layer, or previously deposited layers. Due to the different wetting abilities, the change in morphology can cause the multilayer film to be a more continuous and smooth film or a more discontinuous and rough film, depending upon the desired application of electrodes according to the current invention.

Figure 1B:
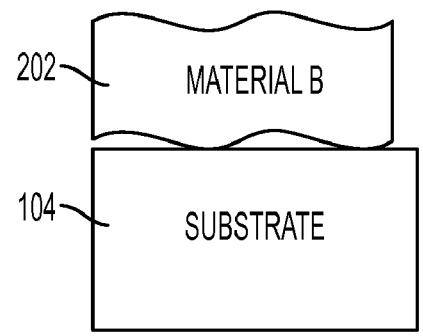
Figure 1C:
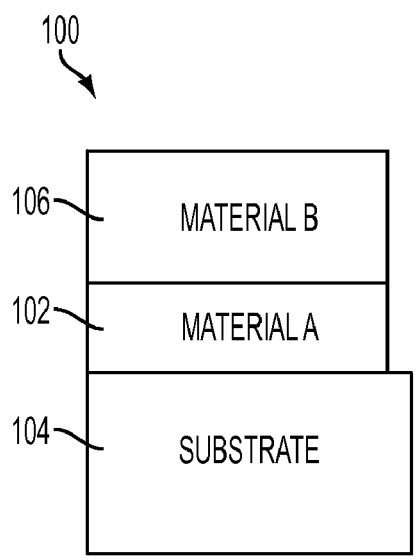
Figure 1D:
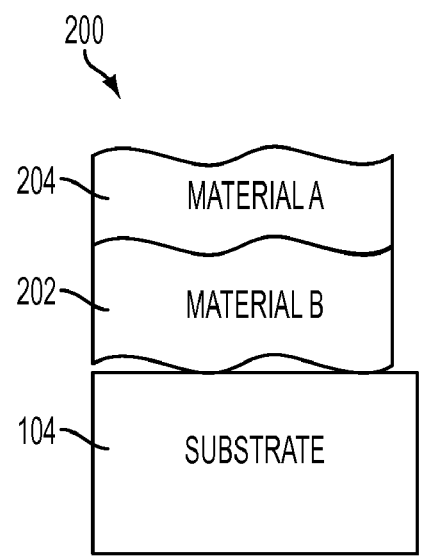

FIGS. 1a-1d schematically illustrate an embodiment of an electrode according to the current invention. A two-layer electrode 100 is illustrated in FIG. 1c and a two-layer electrode 200 is illustrated in FIG. 1d. In forming the electrode 100, a first layer of electrically conductive material 102 (Material A) is formed on substrate 104 (FIG. 1a). This layer 102 may also be referred to as a "wetting layer." A wetting layer according to this invention may be selected to be a material having wetting ability with respect to the particular substrate according to the desired application. For example, one may select a material that has relatively good wetting ability for some applications, or relatively poor wetting ability in other applications. This invention is not limited to a particular wetting ability of the wetting layer 102.

A second layer of electrically conductive material 106 of a Material B, different from Material A, is formed on the wetting layer 102 (FIG. 1c). In order to explain some concepts of the current invention, an electrode 200 is formed of the same materials as electrode 100 on a substrate of the same or similar material, but in opposite order (FIGS. 1b and 1d). In this case, the wetting layer of Material B is formed on substrate 104 (FIG. 1b). Then a second layer of electrically conductive material 204 is formed on the wetting layer 202. Each of the layers of electrically conductive materials 102, 106, 202 and 204 may be formed by a deposition method, for example, by one of the methods specified above. The examples of FIGS. 1c and 1d are for two-layer electrodes. However, the broader aspects of this invention are not limited by the specific number of layers of the electrode. Additional layers of Material A and/or B and/or other materials may be formed on top of the two layers illustrated in these examples.

If Material A has better wetting ability than Material B on the substrate 104, given the same thickness, Material A will form a better film (FIG. 1a) than Material B on the substrate alone (FIG. 1b). If the wetting ability of Material B on Material A is good, then when the multilayer structure such as the one 100 shown in FIG. 1c is formed, Material B will form a more continuous and smooth film. The continuousness and smoothness of the film will enhance the optical transparency and the electrical conductivity of the film 100. If the film has voids and is too rough, these surface characteristics may result in optical absorption and light scattering which will reduce the optical transparency of the film. Conversely, an opaque film 200 may be achieved by depositing a layer 202 which has poor wetting ability on the substrate 104, as in FIG. 1d. Note that the thicknesses of these layers under discussion are on the scale of nanometers, which is well below the scale of visible wave lengths. Nano scale voids or particles formed during deposition of these films may cause scattering and absorption of visible light. For example, Copper (Cu) has better wetting ability on glass than Silver (Ag). A glass/silver (6 nm) structure will have lower optical transparency than a glass/copper (0.5 nm)/silver (6 nm) structure.

In some cases, a material with lesser wetting ability may also serve as a good wetting layer. Although a material may have poor wetting ability, if it is thick enough, it will eventually form a continuous film. For example, Aluminum (Al) has lower wetting ability than Copper (Cu) on a glass substrate. In the case of the glass/aluminum/copper electrode structure, the optimal thickness of Al is about 2-3 nm for an 8 nm thick layer of Cu. As long as the thickness is below its skin depth, it can serve as a good wetting layer since it is already a more continuous film.

The layered structure of the electrode is not limited to only two layers. Structures of three or more layers of materials may also be constructed to control and optimize the electrical conductivity and optical transparency of the multilayer film. For example, a gold (0.2-0.3 nm)/aluminum (2-4 nm)/gold (9-11 nm) structure has various wetting layers to achieve optimal transparency.

By controlling the deposition rate of the materials, the roughness of the electrode film may also be controlled. A smoother film can be achieved with a higher deposition rate and a rougher film may be achieved with a lower deposition rate. This control may be used in conjunction with the wetting abilities of the materials to achieve the desired electrical conductivity and optical transparency of the electrode.

With controlling the thickness of this stacked layer, it can also be utilized as the middle layer for any type of tandem cell structure electronic device. Another function for this stacked layer structure is to be used as a proper buffer layer for electronic devices. For example, this buffer layer is sandwiched between the active layer and a conductive or non-conductive capping layer of a light emitting or photo-voltaic device. The deposition methods of this non-conductive or conductive layer can include, but are not limited to thermal evaporation, e-beam evaporation, sputtering, MBE, CVD, plasma-enhanced deposition, spin-coating, dip-coating, electro plating, electroless plating, organic vapor jet printing, and ink-jet printing.

EXAMPLE A

Semi-Transparent Multilayer Stacked Metal Cathode for Polymeric Light-Emitting Diodes In an embodiment of this invention, a semi-transparent metallic film made of gold/aluminum/gold thin multilayers was used as the cathode in polymeric light-emitting devices. Physical properties of the cathodes were characterized by current-voltage measurement, ultraviolet-visible transmission spectroscopy, and atomic force microscopy. The optical transparency of the device reaches as high as about 70% in the visible region without a capping layer, and the electrical sheet resistance reduces to below 10 ohms/square. For a polymer light-emitting device in an embodiment of this invention, approximately 47% of light emits through the top cathode surface, and 53% through the ITO side. Morphology modification at each interface of the cathode appears to play an important role in fixing the transparency and conductivity. This technique offers precise control of the optical and electrical properties of the cathode without using a sophisticated evaporation process.

Foremost among the advantages of polymeric light-emitting displays (PLEDs) over their liquid crystal display counterparts is their emission nature, which makes them pleasant to the eye and requires no backlight illumination. Traditional PLEDs consist of one or two thin (typically about 90 nm) polymer layers sandwiched between a conductive surface electrode and a transparent substrate. The surface electrode is the cathode which can be specially designed to facilitate the electron injection, whilst the substrate is typically a standard indium-tin-oxide (ITO) coated glass, through which the electroluminance (EL) from the polymer layer is emitted. See, J. H. Burroughes, D. D. C. Bradley, A. R. Brown, R. N. Marks, K. Mackay, and R. H. Friend, Nature, 347, 539, (1990). Surface-emitting PLEDs are important for display and communication applications (C. N. King, *Inorganic and Organic Electroluminescence*, edited by R. H. Mauch and H.-E. Gumlich (Wissenchaft & Technik Verlag, Berlin, 1996), p. 375). It is often desirable to monolithically integrate PLEDs on a silicon chip and under which the peripheral electronics, such as transistors, and pixel switching circuits can be placed. A transparent cathode may also be utilized in transparent displays where light can be received from both the anode and the cathode (A. Yamamori, S. Hayashi, T. Koyama, and Y. Taniguchi, *Appl. Phys. Letts,* 78, 3343 (2001)). Despite such importance, there have been few studies on these surface-emitting devices and they have reported inadequate cathode transparency with acceptable device performance. (See, V. Bulovic, P. E. Burrows, S. R. Forrest, and M. E. Thompson, *Appl. Phys. Letts,* 68, 2606 (1996); L. S. Hung and C. W. Tang, *Appl. Phys. Letts,* 74, 3209 (1999); G. Pathasarathy, P. E. Burrows, V. Khalfin, V. G. Kozolov, and S. R. Forrest, *Appl. Phys. Letts,* 72, 2138 (1998); V. Bulovic, P. Tian, P. E. Burrows, M. R. Gokhale, S. R. Forrest, and M. E. Thompson, *Appl. Phys. Letts,* 70, 1954 (1997); and H. Kim, C. M. Gilmore, J. S. Horwitz, A. Pique, H. Murata, G. P. Kushto, R. Schlaf, Z. H. Kafafi, and D. B. Crisey, *Appl. Phys. Lett.* 76, 259, (2000).)

In general, there are two methods currently used to fabricate a transparent cathode. The first method is to sputter transparent conductive oxides such as ITO on the device with a buffer layer. As an example, the use of a thin bilayer of magnesium/silver (Mg/Ag) as the buffer layer to protect against sputtering damage and to help electron injection of the cathode has been reported. V. Bulovic, P. E. Burrows, S. R. Forrest, and M. E. Thompson, *Appl. Phys. Letts,* 68, 2606 (1996) and M. E. Thompson, S. R. Forrest, P. Burrows, U.S. Pat. No. 5,986,401. The insertion of a thin organic film as a buffer layer between an overlying ITO layer and the device has also been reported. L. S. Hung and C. W. Tang, *Appl. Phys. Letts,* 74, 3209 (1999) and G. Pathasarathy, P. E. Burrows, V. Khalfin, V. G. Kozolov, and S. R. Forrest, *Appl. Phys. Letts,* 72, 2138 (1998). However, both techniques require the sputtering of ITO, in which the damage of the light-emitting layer is unavoidable. One of the intrinsic properties of the low-work function metals is their high susceptibility to atmospheric oxidation. For instance, Mg/Ag always demonstrates inadequate corrosion resistance in ambient environments. C. W. Tang and S. A. Vanslyke, *Appl. Phys. Lett.* 51, 913, (1987). The notion to insert some organic layers as part of the cathode structure will eventually alter the electronic parameters of the device due to the presence of new interfacial states and formation of charge-injection barriers. The second method is to use stacked metal layers with or without a capping layer. A multilayer stacked cathode structure has been employed consisting of an ultra thin lithium fluoride/aluminum/silver layer with a capping layer for refractive index matching to enhance the optical transparency of the overall device. L. S. Hung, C.

W. Tang, M. G. Mason, P. Raychaudhuri, and J. Madathil, *Appl. Phys. Letts*, 78, 544 (2000). Their results indicate that 30% of the light is able to exit through the top cathode and 70% through the bottom ITO surface. The preferable capping layer also requires a sputtering process. A double-layer calcium/silver stacked metal cathode has been constructed on organic light-emitting diodes. R. B. Pode, C. J. Lee, D. G. Moon, and J. I. Han, *Appl. Phys. Lett.* 84, 4614, (2004). The authors demonstrated that the optical transmittance of the cathode reached as high as ~70% when it was evaporated on a glass substrate, but not on the device. Again, the use of reactive metals and an insufficient capping layer may decrease the device lifetime.

Because the structure, composition, and deposition technique of the cathode dictates its final physical properties and the device performance, the design and fabrication of transparent cathodes are important for high-definition organic displays. However, good electrical conductivity and optical transparency in the visible range are two conflicting parameters of a particular material. It is well known that bulk metals and thick metal films are good electrical conductors, but their transmittance decreases as the thickness increases. P. W. Gilberd, *J. Phys. F: Met. Phys.*, 12, 1845, (1982). In this example, we demonstrate a unique multilayer cathode structure for PLEDs, with primary focus being on achieving high optical transparency and electrical conductivity through control of the evaporation rate (and related morphology) and individual layer thickness. In this example, the cathode is composed of three metal layers; an ultra thin 0.2-0.5 nm buffer layer of Au is first evaporated onto the PLEDs which allows the second overlaid 2-4 nm-thick Al layer to interact with the PLED for efficient electron injection. The third 9-11 nm-thick Au provides the necessary transparency and protects the cathode. The cathode transparency is mainly determined by the thin Au buffer layer as a result of the morphology modification at each interface of the successive layers. The PLEDs integrated with the stacked transparent cathode, even without a capping layer, provides 47% of light through the cathode surface and 53% through the ITO surface. In fact, only one more type of non-reactive metal is introduced. This technology requires no modification of the existing evaporation system.

The semi-transparent cathodes were evaporated on polymeric light-emitting diodes (PLEDs) with structure of glass/ITO/poly(3,4-ethylenedioxythiophene (PEDOT)) (50 nm)/green fluorine-containing co-polymer (5BTF8) (80 nm)/barium acetylacetonate [Ba(acac)$_2$]/cathode. The fabrication details of the organic layers were reported elsewhere in Q. Xu, J. Ouyang, Y. Yang, *Appl. Phys. Lett.* 83, 4695, (2003); the entire contents of which are incorporated herein by reference. Three different types of cathode structure were fabricated and integrated with PLEDs for comparison. The first one is only Au, the other is Al/Au, and the remaining is Au/Al/Au. Other metal such as Cu instead of Au was used for further comparison. The evaporation rates of Au and Al were 0.01-0.06 and 0.05-0.1 nm/s respectively. The devices were evaporated in a chamber with base pressure maintained at ~1×10$^{-6}$ Torr, and the chamber was located within a MBraun nitrogen filled box with oxygen and moisture level maintained at 1 PPM. This was to insure that the oxygen level during evaporation was minimized. The current-voltage (I-V) characteristics and electroluminescence (EL) were measured by a Keithley 2400 source measure unit with calibrated silicon photodiode and a Photo Research PR 650 spectrophotometer. The transparency measurements were measured within the visible range from 350 to 800 nm with a Varian Cary 50 Conc ultraviolet-visible spectrometer. Atomic force microscopy was performed by Digital Instruments Multimode Scanning Probe Microscope. The scan size was 2 μm and the scan rate was 2 Hz. A four-probe method for resistivity measurements was employed to estimate the electrical properties.

An important aspect of the semi-transparent cathode of this example is its ability to conduct electricity. In general, when radiation is shone onto a metal surface, a significant part of the light will travel a short distance, δ, into the metal surface before it is reflected. This distance, known as the skin depth, is the distance where the transmitted light amplitude is reduced to about 36.8% of the incident light amplitude. The metals we used in this example are mainly composed of Au and Al. The δ for Au and Al at wavelength λ=500 nm are 22 and 6 nm, respectively. Therefore, when the Au and Al layers are thinner than δ for the corresponding material, sufficient light can penetrate them. R. A. Chipman, *Theory and Problems of Transmission Lines* (Schaum Outline Series 1968) p. 78 & 85. In our cathode structure, both Au and Al thicknesses are well within their δ s.

Figure 2A:
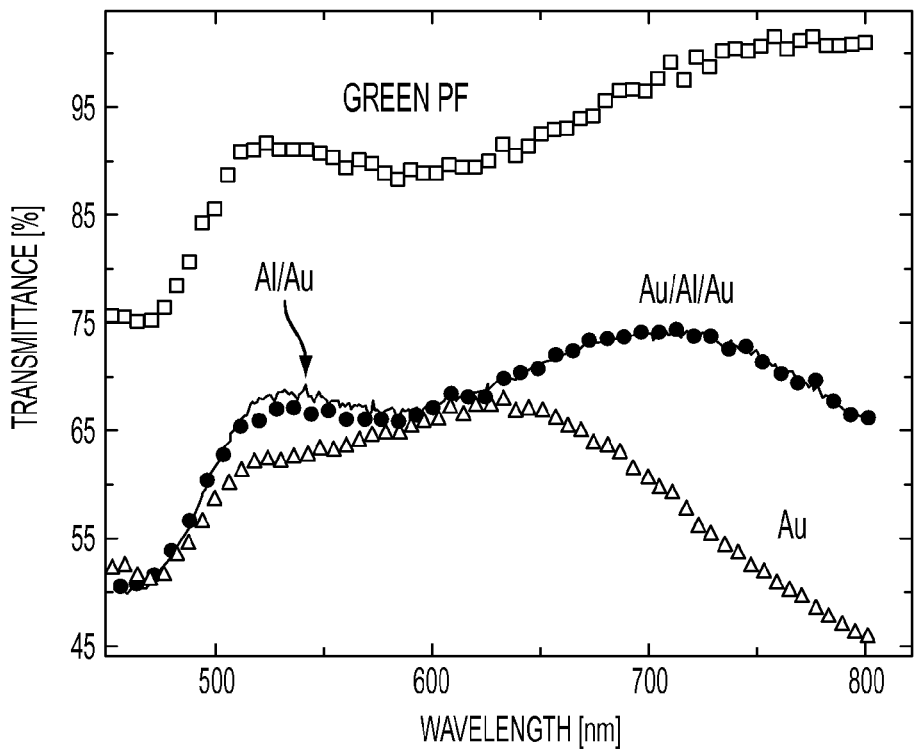
FIGS. 2a and 2b show optical transmission spectra of PLEDs with various cathode structures.
Figure 2B:
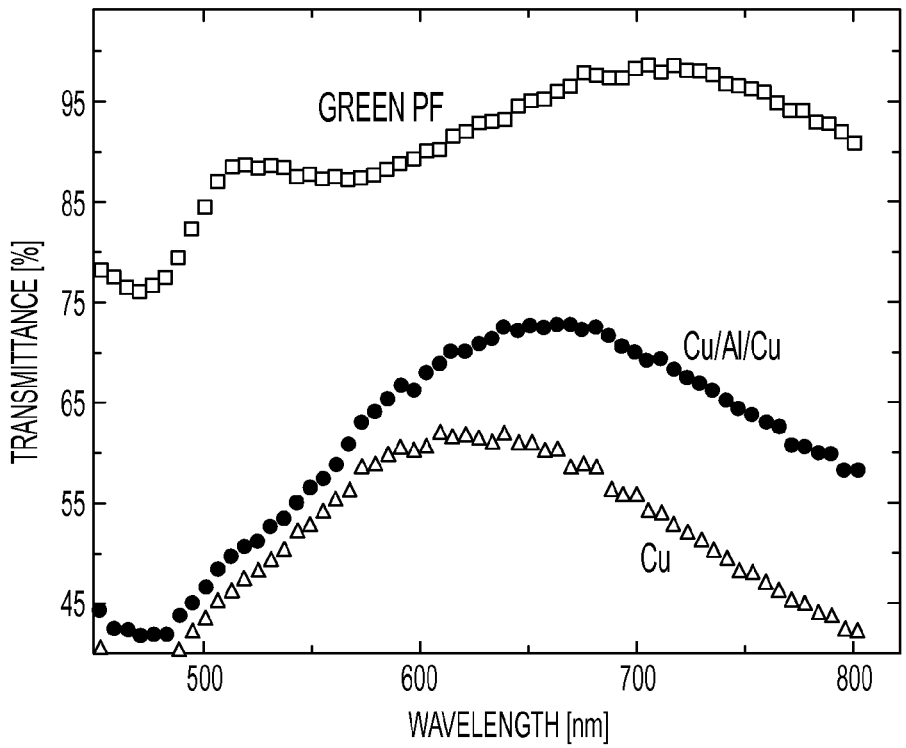

The transparent cathode PLEDs displayed high transparency when the devices were turned off. FIG. 2a shows the transmission spectra of the green PF device with and without the cathodes. All the transmission spectra were normalized with respect to that of ITO. The green PF device without the cathode showed nearly 90% transmittance in the visible range. To illustrate the strong dependence of the transmittance on the constituency and thickness of each individual layer of the cathode, we evaporated three devices with different cathode structure; the first one with only Au film, then second with Al and Au layers, and the third with the whole cathode structure, Au/Al/Au. The device with only Au as a cathode (labeled as Au) showed a significant reduction of transmittance ~20% in the visible spectrum. Both the bilayer and trilayer cathode devices, labeled as Al/Au and Au/Al/Au, demonstrated an enhancement of transmittance compared with the Au only device even though the overall thickness of the stacked cathodes are thicker. The enhancement is more pronounced in the spectrum ranging from 600 to 800 nm. The underlying physics of using a trilayered structure for a cathode is not be restricted to the use of Al and Au. Some degree of universality for other electrode materials has also been exhibited. We have tried other metal combinations, and the effect was similar. For example, Al, Au; Au, Al, Au; Al, Cu; Cu, Al, Cu; Cu, Ag; Ag, Cu; Au, Ag; Ag, Au; Ca, Ag; Ag, Ca; and Cr, Au metal combinations were tried. However, this invention is not limited to only these examples of possible metal combinations. Other combinations may be used without departing from the teachings of this invention. The combination of Au/Al/Au metal showed the highest transparency, however, the concepts of the invention are not limited to only this combination and not limited to only these materials. FIG. 2b shows the device transmittance when using Cu/Al/Cu compared to an 8 nm Cu as cathode. Again, the PLEDs showed enhanced transmittance when using a trilayer cathode according to the current invention. Our data revealed the fact that the skin depth and morphology at different layers significantly influenced the transmittance behavior of the transparent cathode. From the results presented here, the optimum thicknesses of individual layers in the cathode stack in this example for the highest transmittance were found to be from 0.2-0.5, 2.0-4.0, and 9.0-11.0 nm for bottom layer Au, second layer Al, and top Au protective layer. For the case of Cu/Al/Cu structure, the thickness ratio is 0.2-0.5/2.0-4.0/8.0-11.0 nm, respectively. The overall transmittance of the cathode is determined by optical interference effects, absorption losses and electrical properties and can be, in principle, controlled by tailoring each metal thickness in the cathode. In these examples, the bottom layers of Au and Cu are the "wetting layers."

Figure 3:
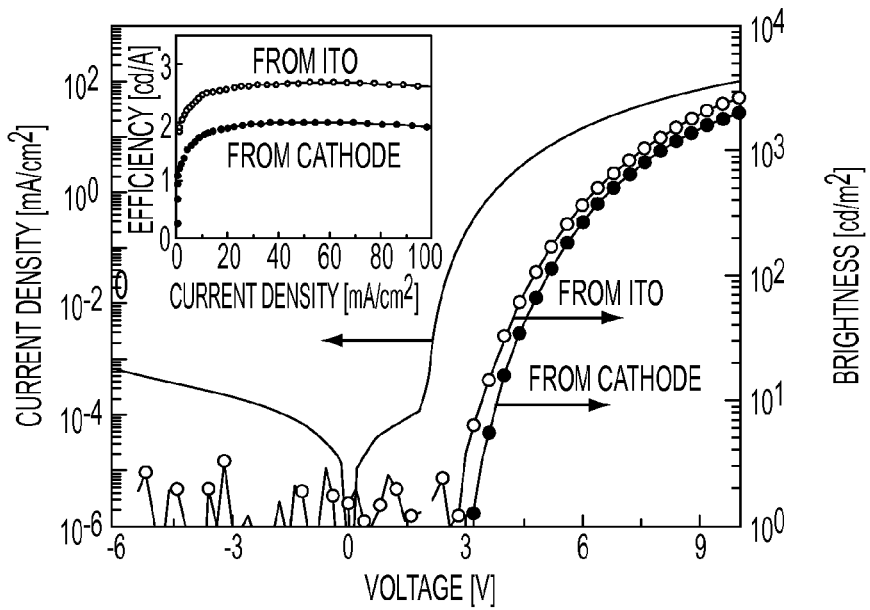
FIG. 3 shows light-current-voltage characteristics of a polymer light-emitting device with structure: glass/ITO/poly(3,4-ethylenedioxythiophene (PEDOT)) (50 nm)/green fluorine-containing co-polymer (5BTF8) (80 nm)/barium acetylacetonate [Ba(acac)$_2$]/Cathode (Au (0.25 nm)/Al (2 nm)/Au (90 nm)).
Figure 4:
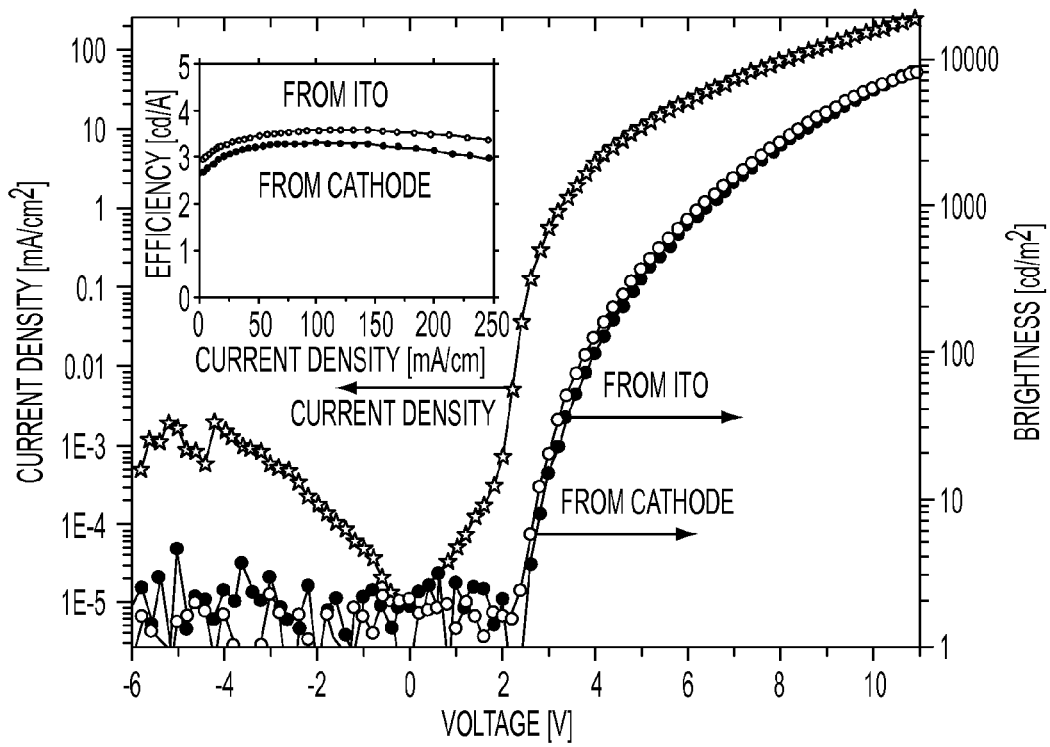
FIG. 4 shows light-current-voltage characteristics of a polymer light-emitting device with structure: glass/ITO/poly(3,4-ethylenedioxythiophene (PEDOT)) (50 nm)/green fluorine-containing co-polymer (5BTF8) (80 nm)/barium acetylacetonate [Ba(acac)$_2$]/Cathode (Au (0.3 nm)/Al (3 nm)/Au (100 nm)).

FIGS. 3 and 4 show the I-V characteristics and EL of the PLED with the triple Au/Al/Au structured cathode. There was about 10% difference in brightness between the top and bottom emission when the device was turned on. For example, a luminance of 832 and 789 cd/m$^2$ were achieved, respectively, from the ITO and cathode surfaces at a current density of 25 mA/cm$^2$. The small reduction in EL through the cathode surface was an indication of weak optical absorbance of the transparent cathode. The semi-transparent PLED provided 47% of EL through the surface cathode and 53% through the bottom ITO. The electrical sheet resistance of the multilayer cathode was below 10 ohms/square. The total efficiency of the device displays in the inset of FIG. 4 is about 6.7 cd/A, which is lower than that (~8 cd/A) from a control device with Al as the cathode. This is ascribed to the finite sheet resistance of the Au/Al/Au cathode.

Each interface of the cathode is suggested to be formed as a result of the subsequent morphology modification involving [Ba(acac)$_2$], Au, and Al which dictates the optical and electrical property of the cathode. Each modified layer is observed to be on the order of a nanometer. FIG. 5 shows the atomic force microscopy (AFM) images of (a) the surface of the Au film (9 nm) evaporated on [Ba(acac)$_2$] surface, (b) same as (a) but with a thin layer of Al (2 nm) sandwiched between the Au and [Ba(acac)$_2$] layer, and (c) the Au surface of the transparent cathode with structure Au (0.25 nm)/Al (2 nm)/Au (9 nm) in the first, second and third rows, respectively. The results of AFM showed that the surface of Au evaporated on [Ba(acac)$_2$] surface was very rough (surface roughness ~2.500 nm) compared with the same Au surface (surface roughness ~1.159 nm) but with Al underneath. It is worth noting that the transparency was higher (data not shown here) even though the total thickness of the cathode was increased by 2 nm. The role of this Al layer was (i) to interact with the [Ba(acac)$_2$] layer so as to lower the work function of the cathode to increase the electron injection property of the cathode, and (ii) to smoothen the [Ba(acac)$_2$] surface underneath. By smoothening out the bottom surface, the overlying Au surface roughness is further reduced. As shown in FIG. 5 (second row), the reduction in surface roughness is the main cause of the enhancement of the optical transparency of the cathode. The device stability is relatively low using either Au alone or a two stacked metal structure as the cathode. In fact, both Au and Al/Au stacked metal cathodes decay readily as the device is lit up in the glove box. However, a tremendous improvement in the performance and stability can be achieved by evaporating an ultra-thin layer of Au before the deposition of Al and the successive Au layer. By virtue of the higher wetting ability of Au compared to Al, this ultra-thin Au layer acts as a wetting layer and further smoothens the entire cathode. The thickness of the Au buffer layer is an important factor according this embodiment of the invention. If the layer is too thick, it may set back the interaction between Al and [Ba(acac)$_2$], if it is too thin it may not serve as an efficient wetting layer. It is observed that within a certain range of Au thicknesses, the overlaid cathode surface roughness (~0.941 nm) is reduced as shown in FIG. 5 (bottom row) and it is expected that the device performance is improved accordingly with better interaction between Al and [Ba(acac)$_2$]. However, the overall transparency of the cathode is reduced when one increases the buffer layer thickness. Good results using a Au layer of about 0.25 nm was obtained. The overall cathode thickness with structure Au/Al/Au in this example is 11.25 nm. It has a significant transparency in the visible region, having in addition a low sheet resistance of about 10 ohms/square. Thus, the results indicate that the skin depth and morphology evolution are two important factors responsible for the high transmittance in the triple-metal layer structure in this case. The thickness of each individual layer in the tri-layer structure is dependent on the different electron injection buffer layers deposited underneath. In our case, Ba(acac)$_2$ may have different surface roughness due to the preparation method. Details can be seen from Q. Xu, J. Ouyang, Y. Yang, *Appl. Phys. Lett.* 83, 4695, (2003) which is incorporated herein by reference. Since the thickness of the entire cathode is so thin, the morphology of the layer underneath the cathode is very important for the performance of the cathode.

Figure 5A:
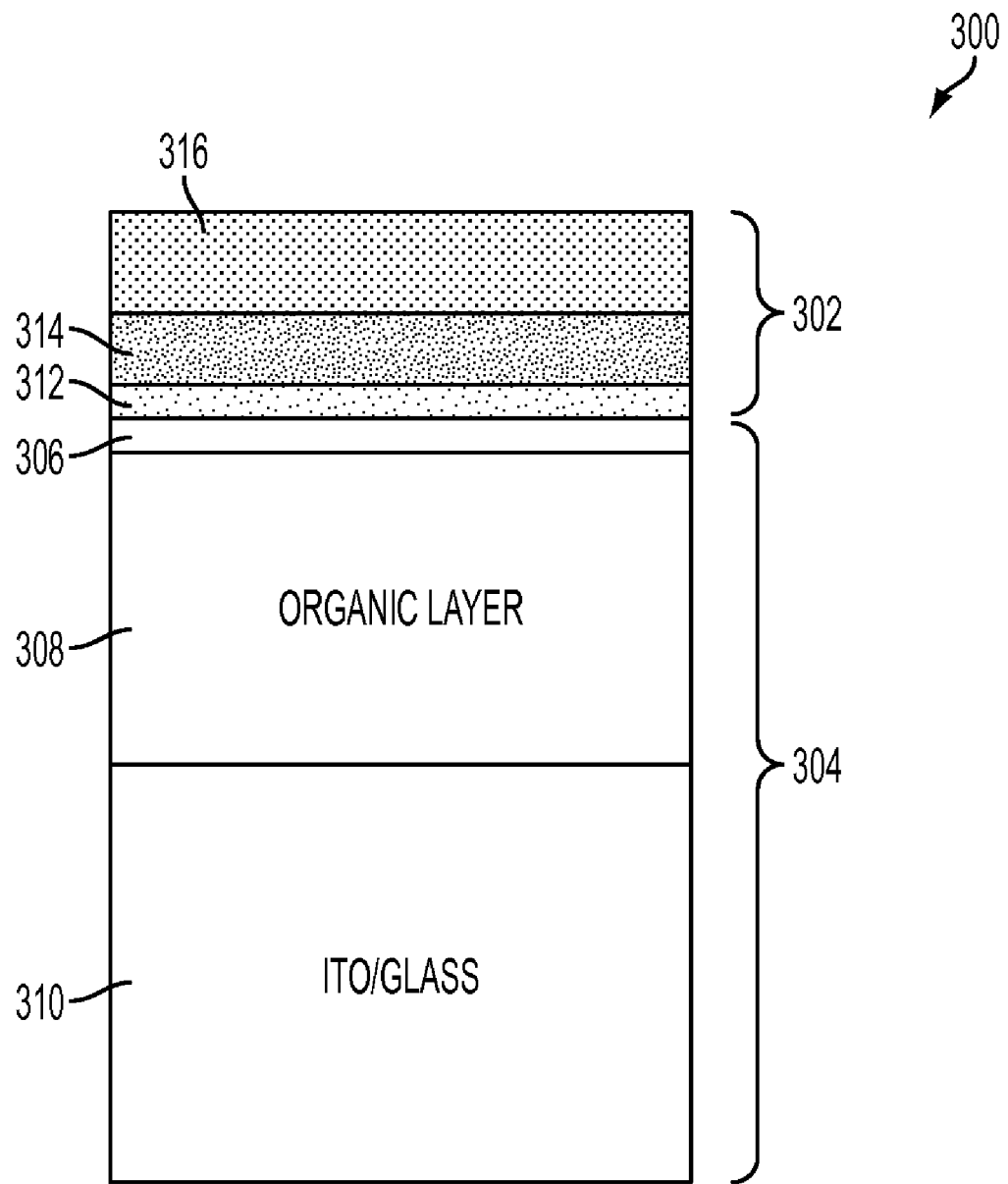
FIG. 5a is a schematic illustration of a PLED that as a stacked electrode according to an embodiment of this invention.
Figure 6:
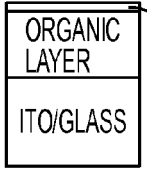
FIG. 6 shows contact angles of water for each of structures indicated schematically adjacent thereto.
Figure 7A:
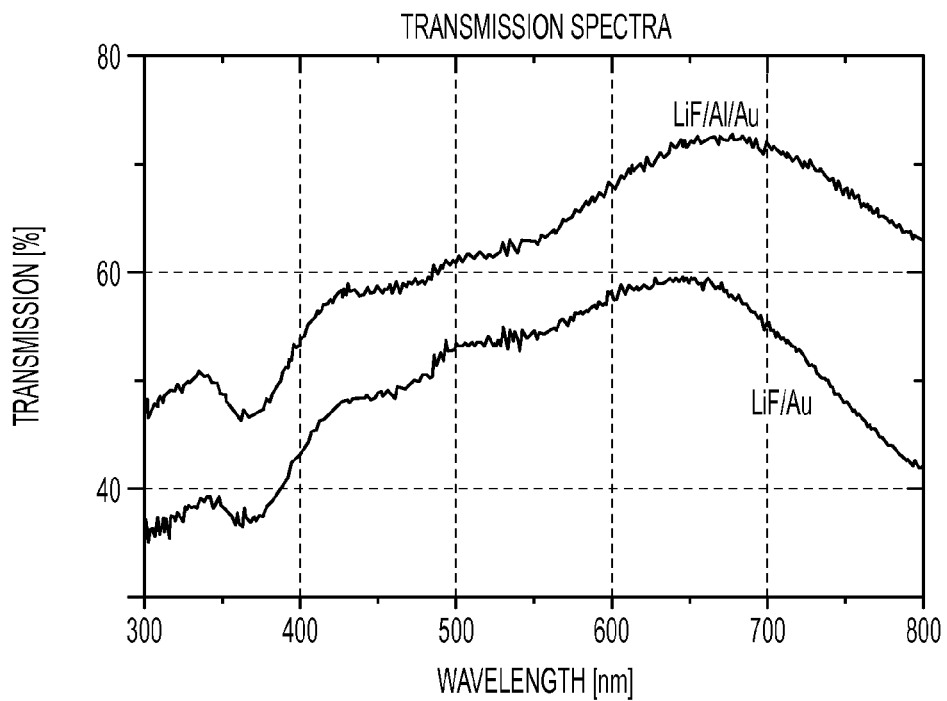
FIG. 7a shows transmission spectra of MEH-PPV based Photo-voltaic device with LiF/Al/Au and LiF/Au cathode.
Figure 7B:
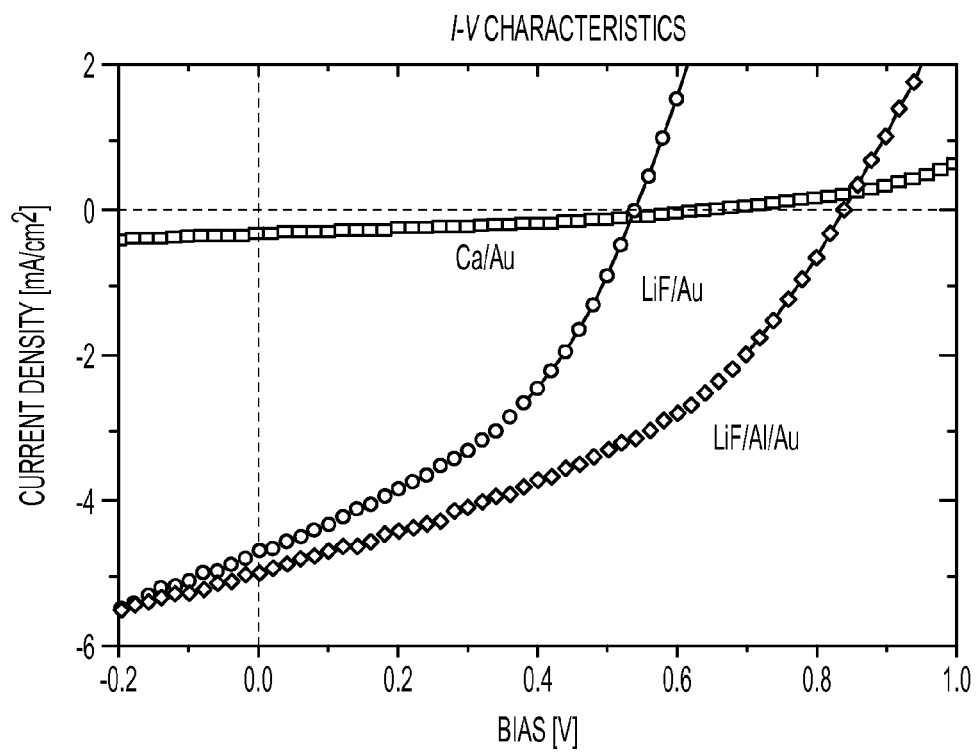
FIG. 7b shows I-V characteristics of MEH-PPV based Photo-voltaic devices with various cathodes. The performance of the device with LiF/Al/Au device has QE of 1.7%, Voc of 0.85V, Isc of 5 mA/cm$^2$, and fill factor of 0.40.

FIG. 5a schematically illustrates a polymeric light-emitting diode (PLED) 300 according to an embodiment of this invention. The PLED 300 comprises a stacked electrode 302 and a substrate 304. The term substrate is used very generally herein to refer to any structure upon which an electrode according to this invention can be formed. A substrate, as used herein, may be a uniform material or it may itself be a complex structure of many materials, such as in this example. The substrate 304 comprises an organic layer structure 306 between an M(acac)$_2$ layer 308 and a glass/ITO layer structure 310. The organic layer 308 is 50 nm of poly(3,4-ethylenedioxythiophene) and 80 nm of green fluorine-containing co-polymer (5BTF8). The layer 308 is barium acetylacetonate [Ba (caca)$_2$]. The stacked electrode 302 is the cathode in the PLED 300. The stacked electrode 302 includes a wetting layer 312, a second layer of electrically conductive material 314, and a third layer of electrically conductive material 316. In this example, the wetting layer 312 is a layer of Au. The second layer of electrically conductive material 314 is an Al layer and the third layer of electrically conductive material is another layer of Au. These materials were found to work well in this example, but the invention is not limited to only these materials. Furthermore, the invention is not limited to a stacked electrode 302 of three layers. Other examples may have stacked electrodes with only two layers or with more than three layers. In this example, a wetting layer 312 of Au having a thickness in the range of 0.2 to 0.5 nm; a second layer 314 of Al with a thickness in the range of 2.0 to 4.0 nm and a third layer 316 of Au with a thickness in the range of 9.0 to 11.0 nm were found to work well.

In conclusion, for this example, nearly transparent cathodes have been integrated in PLEDs by three successive thermal evaporations of common metals. The semi-transparent cathode PLEDs demonstrate extremely low optical absorbance and minimum potential drop across the cathode layers. The best tradeoff obtained between transmittance and sheet resistance characteristics in this example was achieved using a Au(0.2-0.5 nm)/Al(2-4 nm)/Au(9-11 nm) cathode structure; however, the broad concepts of the invention are not limited to only the optimized values for this example. Through the demonstration of the semi-transparent cathode PLEDs with superior device performance, this fabrication technology provides a means to stabilize and standardize the optical and electrical properties of the electrodes used in organic devices.

EXAMPLE B

Stacked Metal Cathode for High Contrast Ratio Polymeric Light-Emitting Devices

In this example, extremely high optical absorbing films made of alternating aluminum-silver layers are used as cathodes in polymeric light-emitting devices (PLEDs). Physical properties of the cathodes may be characterized by current-voltage (IV) measurement, atomic force microscopy, and x-ray photoemission spectroscopy. A slow evaporation rate was used. Each pair of aluminum-silver layer was shown to be in the form of aluminum-aluminum oxide nanoclusters embedded in an amorphous charge conducting network of silver. The nanoclusters helped to absorb and scatter the ambient light effectively. The use of a four-alternating-layer structure in PLEDs demonstrated 126% enhancement of contrast under 1,000 lux ambient illumination. The I-V characteristics of the black cathode PLEDs remained intact when compared with reference PLEDs. This technology offers precise control of the cathode quality in terms of its reflectivity and conductivity.

The fabrication of polymeric light-emitting diodes (PLEDs) with high brightness and efficiency has been shown to be feasible during the last decade and some device prototypes are being considered for market entry. The immediate advantages of using PLEDs are the low cost of materials and ease of manufacture compared to liquid crystal displays (LCDs). An additional and possibly more important advantage is the availability of a broad range of substrates and device structures which can be used to further enhance the device performance. Traditional PLEDs used an indium-tin-oxide (ITO) coated substrate onto which a p-type polymer layer was spin coated. The cathode evaporated onto the device is usually a low work function metal or metal alloy, such as aluminum (Al), magnesium-silver (Mg—Ag), lithium-aluminum (Li—Al) and lithium fluoride-aluminum (LiF—Al). The latter three metal alloys are used to reduce operating voltage and enhance device performance. C. W. Tang and S. A. VanSlyke, Appl. Phys. Lett. 51, 913 (1987); M. Stossel, J. Staudigel, F. Steuber, J. Simmerer, and A. Winnacker, Appl. Phys. A: Mater. Sci. Process. 68, 387 (1999); and L. S. Hung, C. W. Tang, and M. G. Mason, Appl. Phys. Lett. 70, 152, (1997). The polymer layer is usually very thin (approximately 90 nm) and experiences little absorption upon illumination by ambient light. The ambient light, however, after transmitting through the polymer layer, will be reflected by the metal cathode and coupled out of the device through the ITO coated substrate. As a result, the contrast ratio of PLEDs will be significantly reduced by reflected ambient light, thus prohibiting the use of PLEDs for outdoor applications. There have been many attempts to enhance the contrast ratio by inserting an absorption and conductive inorganic layer between the polymer layer and the cathode. J. A. Dobrowolski, B. T. Sullivan, R. C. Bajcar, U.S. Pat. No. 5,049,780 (1990); and L. S. Hung, M. G. Mason, EL000 47, (2000). However, the need for a sputtering process for deposition brings about damage on the polymer layer. Recently, a black cathode consisting of a silicon monoxide doped Al film and an overlaid Al layer has been developed for organic light-emitting diodes (OLEDs) that exhibited superior device performance. F. L. Wong, M. K. Fung, X. Jiang, C. S. Lee, Thin Solid Films 446, 14, (2004). However, in practice, the proposed technique causes the black conductive films to be porous even with precise control of the Al-silicon monoxide ratio during co-evaporation. To reduce the number of pinholes and improve the film uniformity, the thickness of the cathode must be increased; this in turn increases the resistance of the layer.

In this example, we demonstrate a novel evaporation technique and cathode structure, with primary focus being on the physical properties of Al—Al oxide nano-clusters. Such Al—Al oxide nanoclusters are believed to be an important factor leading to the unique light absorbing ability of the electrode according to this aspect of the invention. Since only one more type of metal is introduced in the material system, this technology does not require modification of the existing evaporation system.

Figure 8A:
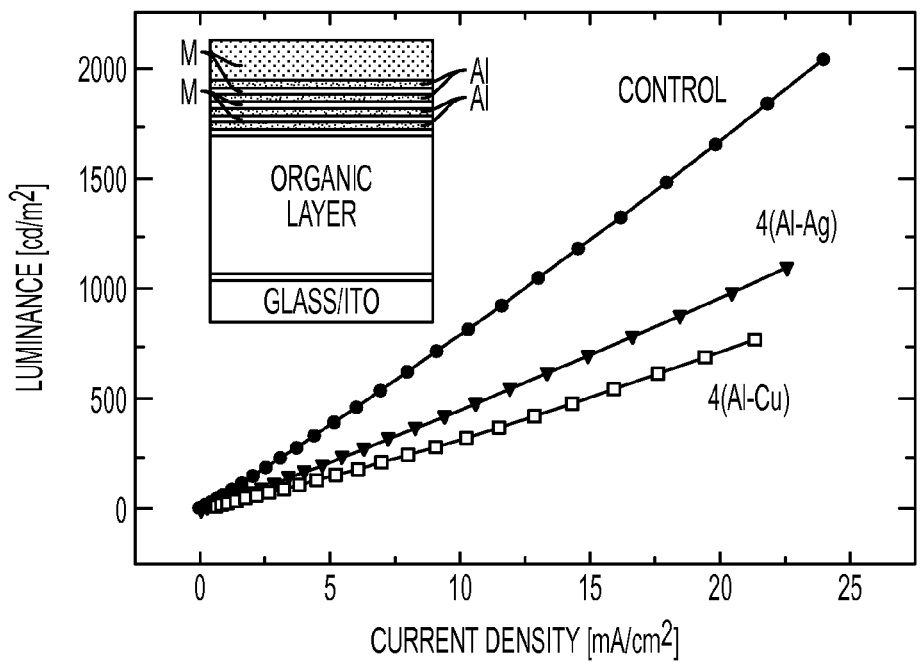
FIG. 8a shows electroluminescence of the black cathode PLEDs and the control device. Inset shows the device configuration of the black cathode PLEDs (M is either Al or Ag).

The inset of FIG. 8a illustrates the black cathode device with a structure of glass/ITO/poly(3,4-ethylenedioxythiophene, (PEDOT)) (500 Å)/green fluorine-containing copolymer (5BTF8)(800 Å)/calcium(2) acetylacetonate ([Ca(acac)2])/×4 Al(40 Å)-Ag(40 Å)/Ag(280 Å). For fabrication details, see Q. Xu, J. Ouyang, Y. Yang, Appl. Phys. Lett. 83, 4695, (2003), the entire contents of which are incorporated herein by reference. It will be shown later that each pair of the Al—Ag layer is used to provide sufficient absorption of the ambient illumination, whilst maintaining good electron injection to the polymeric layer. The merit of using black cathodes for PLEDs was compared with a reference device using Al(60 Å) as a cathode. The thickness of both the Al and Ag were 40 Å. The evaporation rates of Al and Ag were 0.2 and 0.5 Å/s, respectively. Good results were obtained with Al deposition rates slower than or equal to about 0.5 Å/sec. For example, good results were obtained with Al deposition rates of about 0.2 to 0.5 Å/sec. Good results were obtained with Ag deposition rates faster than or equal to about 1.0 Å/sec. For example, good results were obtained with Ag deposition rates of at least 0.5 Å/s or about 1.0 to 2.0 Å/sec. The base pressure of the chamber was maintained at $1 \times 10^{-6}$ Torr. All the PLEDs were encapsulated by a thin glass with sealant in a glove box purged with nitrogen. The current-voltage characteristics and electroluminescence were measured by a Keithley 2400 source measure unit with calibrated silicon photodiode and a Photo Research PR650 spectrophotometer. The contrast ratio measurement was achieved by putting the PLED inside a NewPort 6 inch integrating sphere with a Thermo Oriel 150 W solar simulator as a standard light source. The contrast ratio C was then calculated as $$C = (I_r + I_{on})/(I_r + I_{off}), \quad (1)$$

where $I_r$ is the reflected ambient light from the device, $I_{on}$ and $I_{off}$ are the device luminance when it is switched on and off, respectively. The background was calibrated by measuring the luminance from a rough piece of white paper placed in the integrating sphere. Atomic force microscopy was performed by Digital Instruments Multimode Scanning Probe Microscope. The scan size was 1 μm and scan rate was 2 Hz. For X-ray photoelectron spectroscopy measurement, the sample was prepared by evaporating Al at 0.2 Å/s on a silicon substrate and subsequently covered by fast evaporation of Al at 1.0 Å/s. 5 keV Ar+ ion sputtering was first utilized to remove the covered Al and then the evolution of the spectrum was recorded. The fresh surface was analyzed using Omicron Nanotechnology Multiprobe Surface Science System, with monochromatic Al K radiation.

The black cathode PLEDs displayed black color in the background when the devices were turned off as compared with the control device. FIG. 8a shows the electroluminescence (EL) of the black cathode PLEDs with four alternating layers of Al—Ag and Al-copper (Cu) (labeled as 4(Al—Ag) and 4(Al—Cu)) with respected to the control device. A luminance of 1300 cd/m² was achieved by the control device at a current density of 15 mA/cm², while the black cathode PLEDs with the stacked Al—Ag and Al—Cu had luminance of 640 and 450 cd/m², respectively. The EL of the Al—Ag stacked black cathode PLED is about 50% lower than the control device. This one-half reduction of the EL is an indication of the strong optical absorbance of the black cathode. The EL from the black cathode PLED could not be reflected by the cathode layer as in the case of the control device. The Al—Cu cathode data justified the possibility of using other metals instead of Ag. In our case, the Al—Cu material system brings less attention due to the relatively weak optical absorption. In fact, four alternating Al—Cu stacked cathode PLEDs showed the same luminescence as from the two alternating Al—Ag stacked cathode PLEDs (data not shown here). We have tried to use other metal combinations, such as Al—Au, Au—Al, Al—Mg, Mg—Al, Al—Ca, and Ca—Al. None of them showed optical absorption and electrical conduction as good as Al—Ag; however, the broader concepts of the invention are not limited to only this example.

Figure 8B:
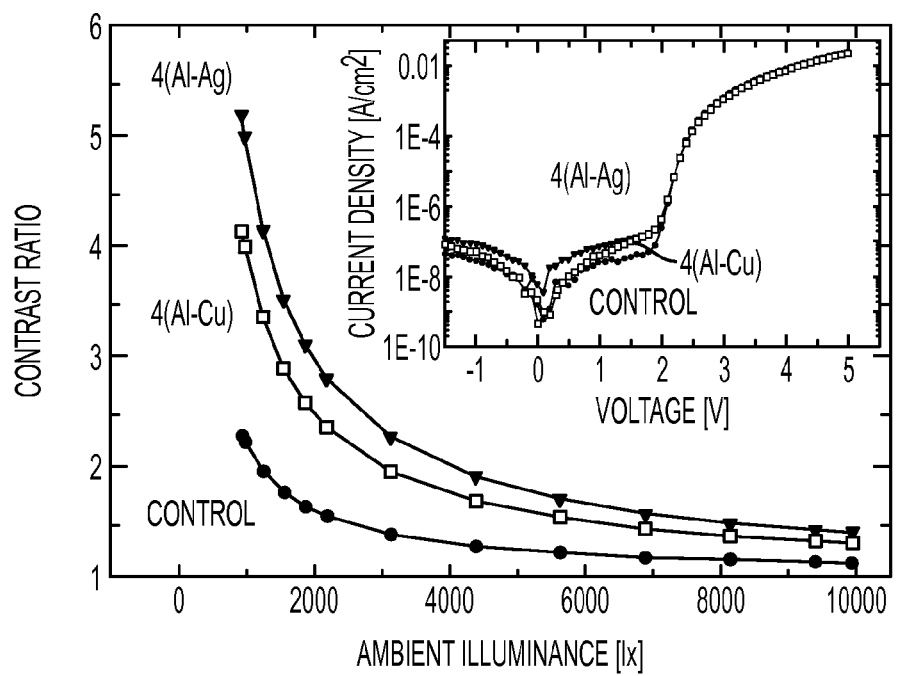
FIG. 8b shows the contrast ratio of the black cathode PLEDs and the control device under different ambient illumination. The inset shows the current-voltage characteristics of the PLEDs.

FIG. 8b presents the contrast ratios of the black cathode PLEDs and the control device under different ambient illumination. During the measurements, both the stacked black cathode PLEDs and the control device were maintained at a luminance of 300 cd/m$^{22}$. Again, the contrast ratio of the Al—Cu stacked black cathode PLED is shown for comparison. The contrast ratio of the Al—Ag stacked PLED is approx. 5.2 under 1,000 1x ambient illumination, which corresponds to a 126% increase in contrast higher than the control device. It is worth noting that the improvement of the contrast is about 25% under 10,000 1x ambient lighting. The black cathode PLEDs show sufficient brightness levels which are suitable for outdoor applications. The inset of FIG. 8b shows the current-voltage (I-V) characteristics of the PLEDs with different metal combinations. The turn-on voltages (approx. 2 V) and the I-V characteristics of the black cathode PLEDs are the same as that of the control device. It is strongly indicative that the integration of the black cathodes with PLEDs only changes their optical absorbance. The technique was proven to be able to form electrical conducting paths for the electrons migrating to the polymeric layer which was in principle, a different approach to the black cathode structure proposed by F. L. Wong, M. K. Fung, X. Jiang, C. S. Lee, Thin Solid Films 446, 14, (2004), which incorporated the doping of silicon monoxide into Al that resulted in a significant voltage drop across the black cathode.

Figure 9A:
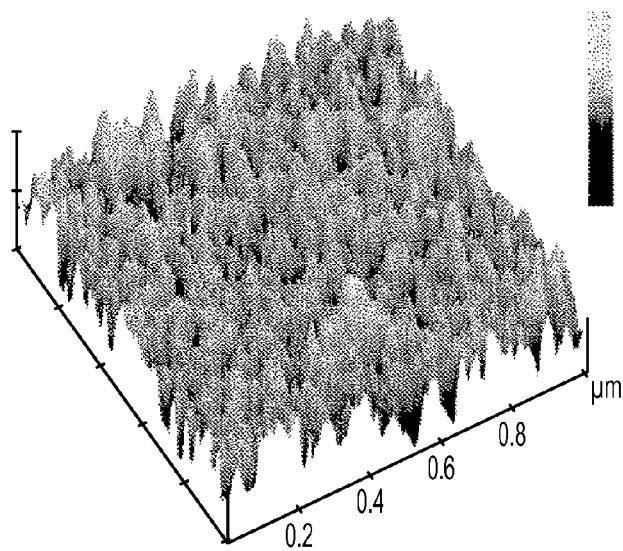
FIGS. 9a-9c show images from atomic force microscopy on the [Ca(acac)2] surface (FIG. 9a), Al surface with [Ca(acac)2] underneath (FIG. 9b), and the successive Ag surface (FIG. 9c). All the image size are 1 μm square.
Figure 9B:
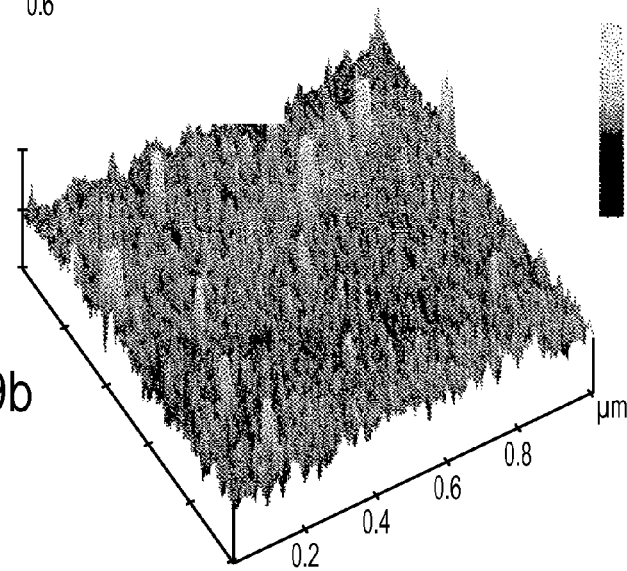
Figure 9C:
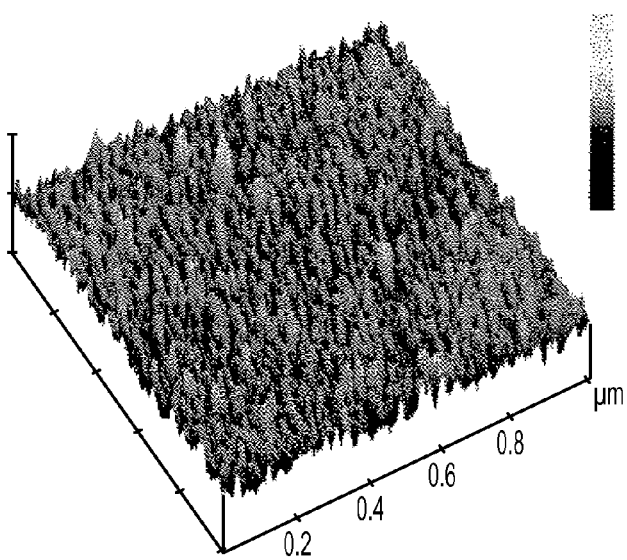

FIGS. 9a-9c show the atomic force microscopy (AFM) images of the [Ca(acac)2] surface, the Al surface after the film (40 Å) was evaporated on the [Ca(acac)2] layer and the Ag surface after the film (40 Å) was successively evaporated on the Al surface, respectively. The results of AFM showed that the evaporated Al formed nanometer-size clusters onto the rough [Ca(acac)2] surface. The surface roughness of the [Ca(acac)2] and the Al surface were approximately 16.5 and approximately 6.7 Å, respectively, indicating that Al was able to smooth the [Ca(acac)2] surface underneath. There are two scenarios that appear to explain this, which are: either the residual oxygen in the chamber acted like surfactant that allowed the high surface free-energy Al to wet the low surface free-energy organic film J. Ivanco, B. Winter, F. P. Netzer, and M. G. Ramsey, Appl. Phys. Letts. 85, 585, (2004), or the Al reacted with oxygen and formed other compounds that could wet the [Ca(acac)2] surface. It will be shown later that the Al is in fact composed of Al and Al oxides. The density of the Al islands was found to decrease with increasing evaporation rate. With the evaporation rate higher than 0.2 Å/s, we observed that the color from the film changed from black to shinny when the film thickness increased above 4 Å. The subsequent Ag film, however, provided a relatively smooth surface as shown in FIG. 9c (roughness approximately 5.2 Å), due to the fact that the wetting ability of Ag was lower than that of the material underneath it. We observed that the evaporation rate of Ag had to be at least about 0.5 Å/s or the cathodes were not conducting.

Figure 10:
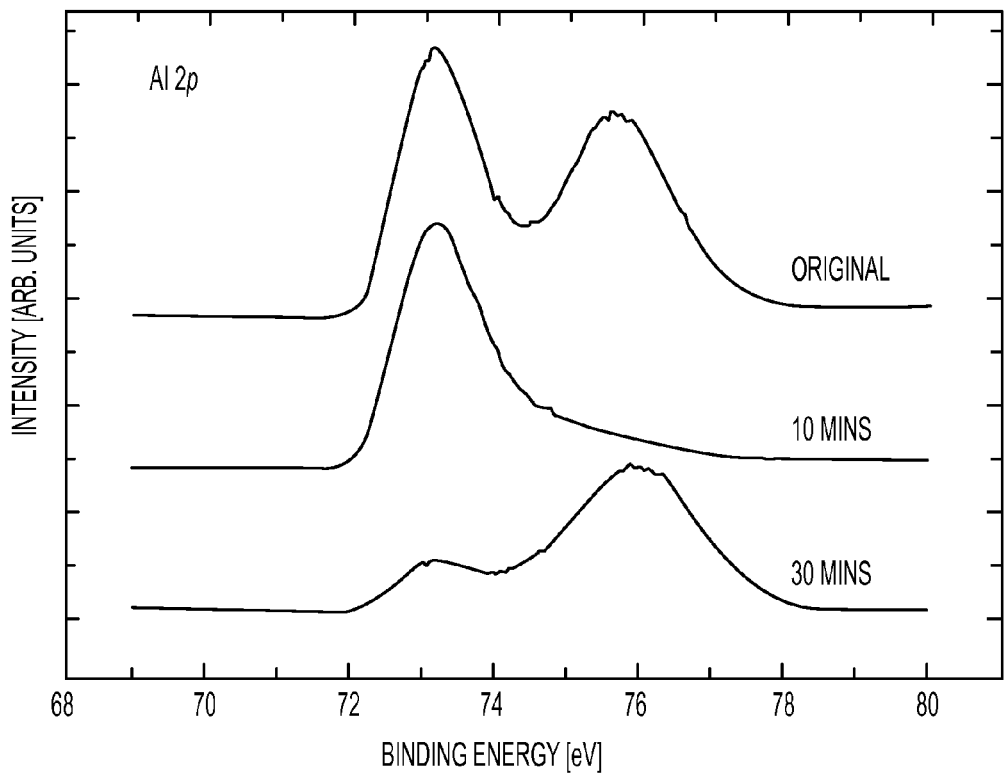
FIG. 10 shows XPS core level spectra immediately taken from the Al-clusters covered with Al after evaporation (labeled as Original) and their evolution (labeled as 10 and 30 mins). Both the spectra labeled as Original and 10 mins have been vertically displaced for clarity.

Lastly, it remains an issue of why the Al-clusters are black in color. In order to probe the physical properties of the unaltered Al-clusters, the sample was covered by a thick Al layer before transporting it into the XPS chamber. FIG. 10 shows the XPS data from the Al-clusters covered with Al (labeled as Original). The features at approximately 73.1 and approximately 75.5 eV Al 2p binding energies belongs specifically to the metallic Al and the most common Al native oxides J. van den Brand, P. C. Snijders, W. G. Sloof, H. Terryn, and J. H. E. de Wit, J. Phys. Chem. B, 108, 6017, (2004). It is well known that Al reacts with oxygen and water to form protective surface oxides under ambient environmental conditions. The Al 2p core level spectrum confirms that the outermost Al surface is covered by Al native oxides. Following the Ar+ ion sputtering to remove the native oxides, the spectrum showed only the characteristic peak of metallic Al after 10 mins, indicating that the native oxides had been removed. With increasing sputtering time, another feature at approximately 76.0 eV Al 2p binding energy appeared with intensity higher than that from the metallic Al. The spectrum suggested that a primary element of the Al-clusters was a mixture of Al and Al oxides which differed from the common native oxides. It was reported that Al oxides formed from Al under oxygen deficient ambient condition were: (i) not pure alumina but with chemical formula, $Al_2O_{x<3}$, and (ii) light-absorption was strongly dependent on the degree of oxygen deficiency. F. L. Wong, M. K. Fung, X. Jiang, C. S. Lee, Thin Solid Films 446, 14, (2004). We conclude that: (i) the exact chemical constituent of the Al oxides may still be unclear, but presumably mainly composed of $Al_2O_{x<3}$, and (ii) the nanoscale clusters as shown in FIG. 9b can be considered as Al embedded in Al oxides because the Al left the crucible and likely interacted strongly with the oxygen residue before reaching the target. As mentioned before, the Al and Ag evaporation rates are important for the nano-clusters formation, according to this aspect of the invention, which dictate the cathode color and the overall conductivity. A similar phenomenon was observed by S. Han, D. Grozea, C. Huang, and Z. H. Lu, J. Appl. Phys. 96, 709, (2004). They report that the size of Al islands increases with increasing Al concentration, which leads to a dramatic reduction in resistivity and optical transmittance. The material system used in Han et al is different from that of the current invention. Our results indicated that the Al-oxides were responsible for the light absorption and further enhance the scattering of ambient light when they are in the form of nano-clusters.

The evaporation of Ag on the Al-clusters not only made their surface smoother as shown in FIG. 9c, but also took the role of charge transporting medium which enhanced the overall conductivity of the paired Al—Ag layers. It is possible to view the metallic Al clusters as being separated by nonconducting $Al_2O_{x<3}$ and conducting Ag. Tunneling conduction between the metallic Al clusters reported by B. Abeles, P. Sheng, M. D. Coutts, and Y. Arie, Adv. Phys. 24, 407, (1975); B. Abeles, RCA Rev. 36, 594, (1975) is assumed to occur. It is considered that with such high conductivity in Ag, the anomalous skin effect could be present. This is the case when the electron mean free path becomes comparable with the skin depth. The collisions of the electrons within the Ag surface are the dominating factor that accounts for the optical properties of the metal. T. Holstein, Phys. Rev. 88, 1427, (1952). The electrons are accelerated and decelerated many times within the skin layer. On average, they absorb no energy from the field unless they undergo a collision. Since collisions with the lattice are unlikely in the anomalous regime, surface scattering is significant. This in turn, contributes to the overall black color of the cathode.

In conclusion with respect to this embodiment of the invention, high optical contrast black cathodes have been integrated into PLEDs by successive thermal evaporation of alternating common metals. The primary chemical constituent and conduction mechanism in the cathodes have been characterized and addressed. The black cathode PLEDs demonstrate extremely high optical absorbance whilst maintaining substantially no potential drop across the cathode layers. Illuminating at a brightness of 300 cd/m$^2$, the Al—Ag stacked black cathode PLEDs have contrast improved by 126% under 1,000 1× ambient illumination. This fabrication technology not only offers black cathode PLEDs with superior brightness level for out-door applications according this embodiment of the invention, but also provides a means to stabilize and standardize the optical and electrical properties of cathodes used in PLEDs.

EXAMPLE C

In this example, a wetting layer may be used to permit decreased working voltage of a device and improved power efficiency.

By inserting a material with high wetting ability with the substrate and the electrode, the contact area of the substrate and the electrode will greatly increase. For example, by inserting a small amount of chromium (Cr) between the active layer and the metal electrode of a light-emitting or photovoltaic device, one can increase the contact area of the active layer and the metal electrode. This increase in contact area can cause the working voltage of the device to decrease and result in improved total power efficiency of the device.

EXAMPLE D

It is generally agreed that fossil fuels cannot last forever. The use of fossil fuels also causes serious environmental problems, such as the greenhouse effect, air pollution and acid rain, etc. Thus the search for clean, inexpensive and renewable energy sources as alternatives to fossil fuels is necessary. One of the options is the solar cell, which converts sunlight to electricity. It is a renewable energy source and can be used as a power source at remote locations. Unfortunately, the cost of solar energy is still far above that of traditional energy. For example, presently energy from solar cells costs 0.2-0.25 dollars per kilowatt-hour, compared to 0.081 dollar per kilowatt-hour for conventional sources. Therefore, there is a need to improve the cost-effectiveness of photovoltaic systems which may be met by developing organic/polymeric solar cells into practical energy sources. The advantages of organic materials include their excellent mechanical properties (flexibility) and the possibility of lightweight, large-area devices having low-cost fabrication.

Efficient photovoltaic cells are believed to have to meet the following criteria: (a) strong absorption of photons and creation of free carriers (electrons and holes) by photo excitation; and (b) a high efficiency of collecting these free carriers. In organic semiconductors, photons are absorbed and tightly bound electron-hole pairs (excitons) are created instead of the free electrons and holes that are created in inorganic materials. To collect the charges, exciton dissociation is required. It is known that exciton dissociation is efficient at interfaces between materials with a sufficient difference of electron affinities and ionization potentials. Often, the exciton dissociation can be as high as 100% in strong electron donor/acceptor systems. Therefore, the bottleneck of organic solar cells is the carrier transport from the (p-n) interface to the metal electrodes. Organic materials suffer from low carrier mobility and short carrier lifetime, which prevent the carriers (electrons and holes) from traveling a long distance before capture by defects or traps. Typical carrier diffusion lengths are around a few nanometers for most organics, well below the typical device thickness of around 100 nm. Hence, the device thickness must be decreased in order to increase the collection efficiency. Unfortunately, the decrease of device thickness significantly decreases the optical absorption as well as increases the complexity of device fabrication.

According to this aspect of the invention, we disclose several approaches to enhance the organic/polymeric solar cell efficiency by (a) increasing the open circuit voltage (Voc) of a single cell by adopting an interfacial material; (b) by physically stacking multiple solar cells one on top of another to form tandem solar cells, which could be with different polymers to cover different absorption spectra; and (c) by fabricating individual solar cells and stacking those cells vertically. Those cells can be connected in series or in parallel to improve the device efficiency. In addition, those solar cells can be made of different polymer/organics to provide different bandgaps to increase the device overall absorption of solar energy.

When combining transparent or semitransparent metals, one can form transparent cathodes according to this invention which can be used in the devices discussed in subsections (b) and (c) below.

Bulk PV Cell Testing and Novel Cathode Material

Figure 11:
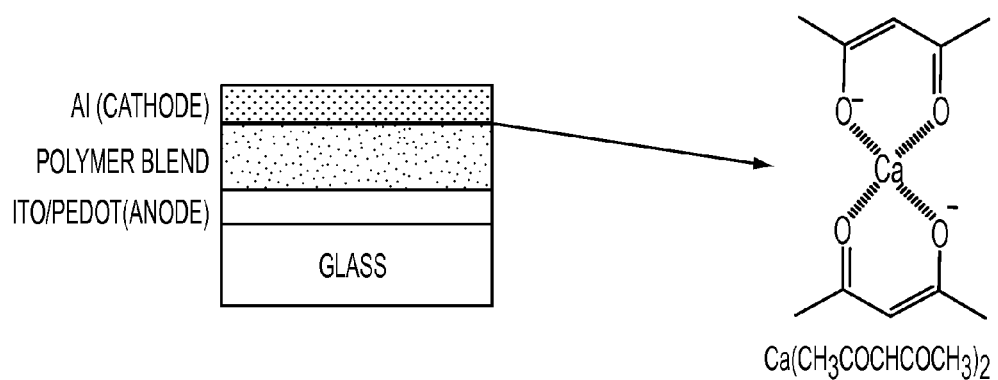
FIG. 11 shows a bulk polymer PV cell device structure according to the current invention. The buffer layer between the Al electrode and the polymer blend is a novel material for the cathode contact.
Figure 12:
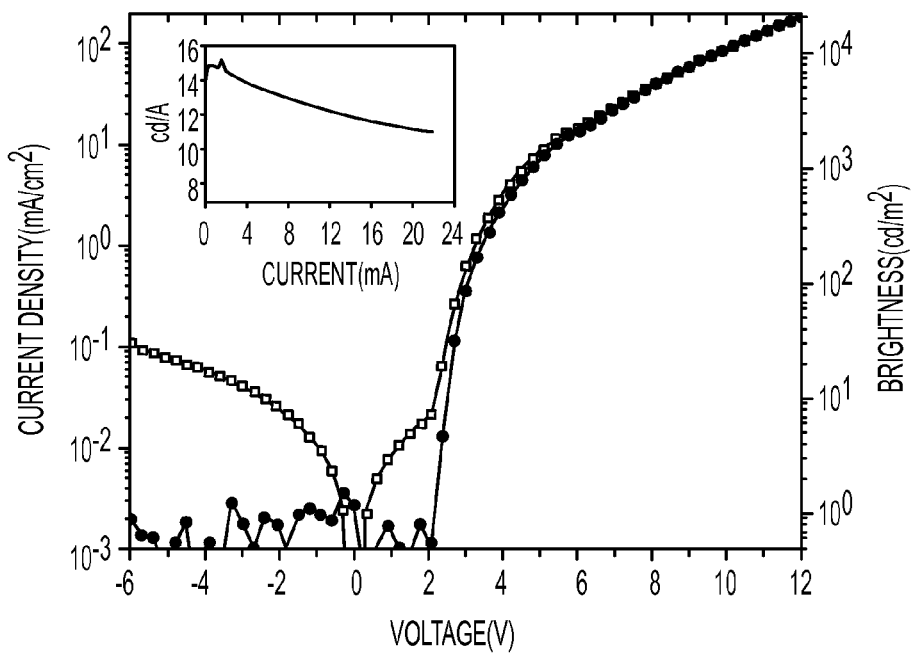
FIG. 12 shows the I-B-V curves of a PLED having a structure is ITO/PEDOT/G-PF/CaX/Al. The device performance is much better than using a Ca electrode.
Figure 15:
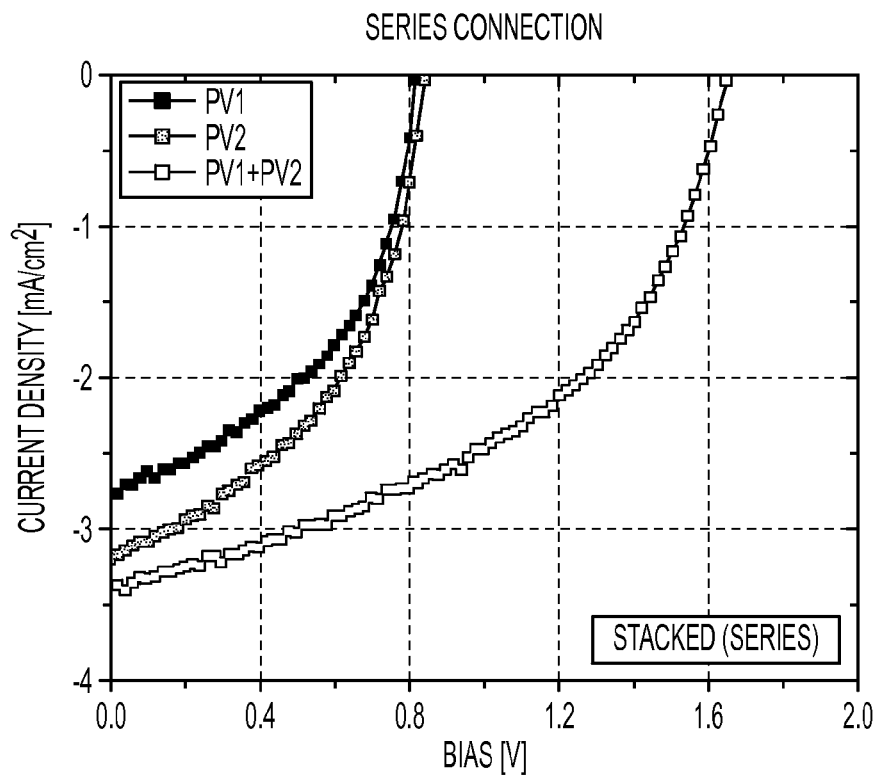
FIG. 15 shows the vertically stacked solar cell in series connection. The devices shown here are of the same polymer, but in practice, polymers with different bandgaps can also be used to cover the whole solar spectrum. The bottom solar cell has a transparent electrode to allow maximum light transmission. The legends correspond to the ordering of the components.
Figure 15:
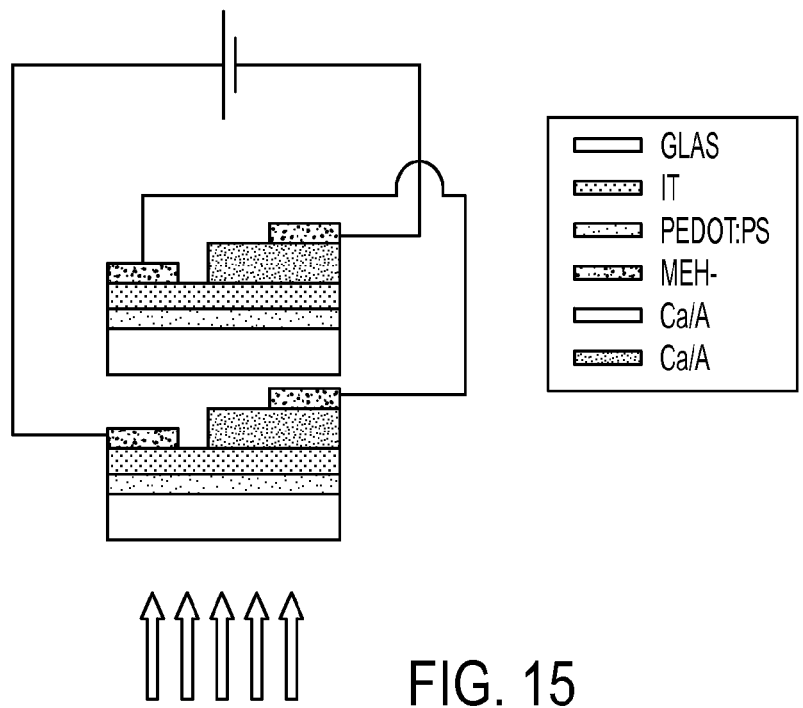
Figure 16:
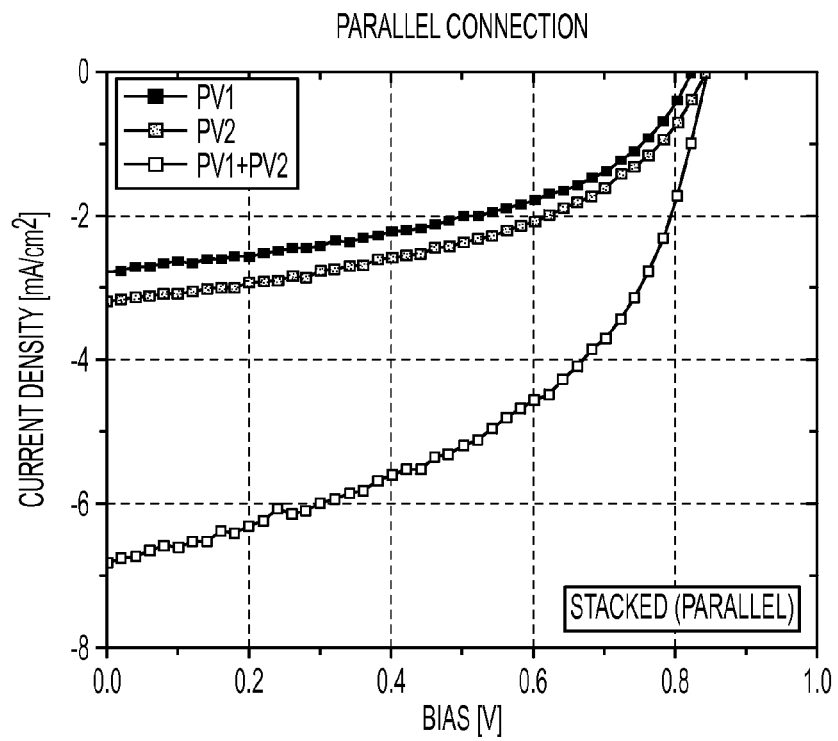
FIG. 16 shows the vertically stacked solar cell in parallel connection. The devices shown here are made of the same polymer, but in practice, polymers with different bandgaps can also be used to cover the whole solar spectrum. The bottom solar cell has a transparent electrode to allow maximum light transmission. The legends correspond to the ordering of the components.
Figure 16:
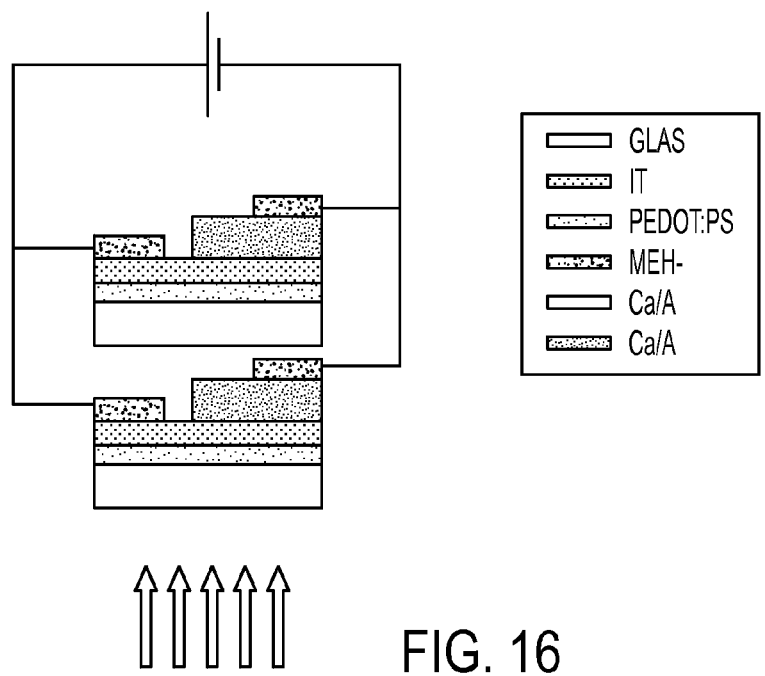

A bulk device with the device structure of ITO/PEDOT/Polymer blend/CaX/A, is shown in FIG. 15, where CaX represents a calcium compound (Ca(acac)$_2$) shown in FIG. 11.

Figure 17:
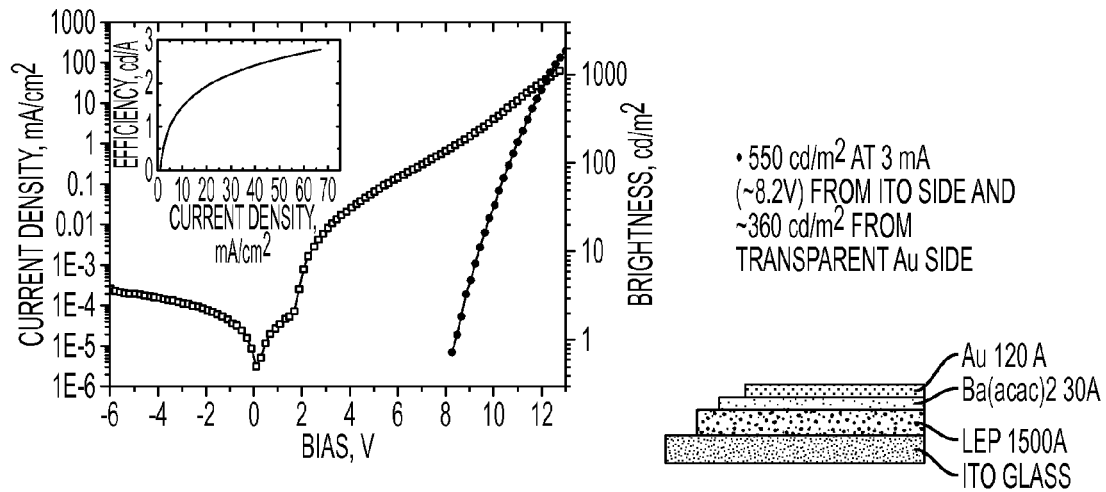
FIG. 17 shows one embodiment of a transparent cathode for polymer LEDs and photovoltaics. The Au film is semi-transparent hence the EL emissions are visible from both sides of devices.

Current results from our PLED have shown that CaX has an excellent performance for electron injection. The I-B-V curves of a green color polyfluorene (G-PF) from Dow Chemicals are shown in FIG. 17. The efficiency of this device is 15 cd/A which is nearly double of that of devices using Ca as the cathode. This compound is solution processible and can be spin coated onto the polymer thin film.

Figure 13A:
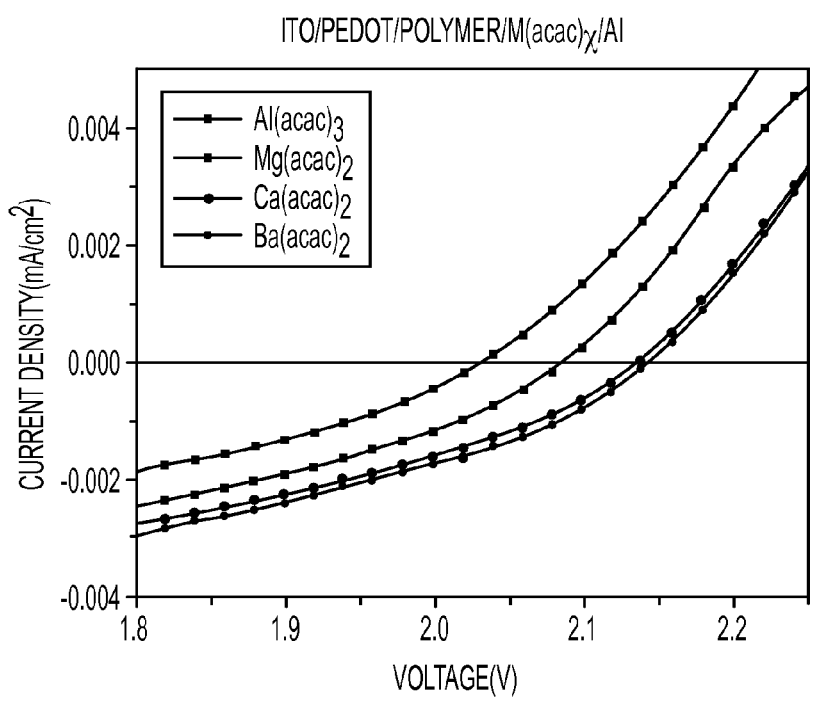
FIG. 13a shows different Voc values from polymer solar cells.
Figure 13B:
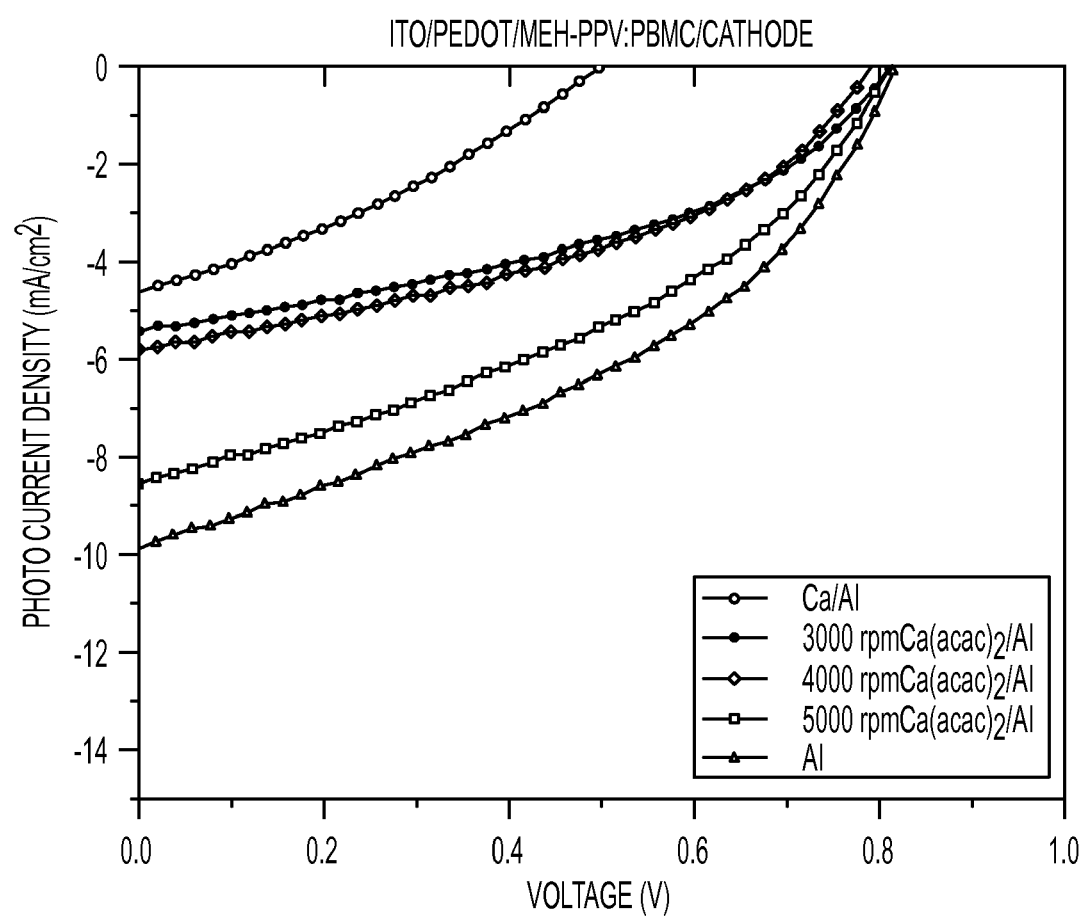
FIG. 13b shows I-V curves of polymer solar cells made of different thicknesses of Ca(acac)2/Al electrodes. In addition, Al and Ca/Al electrodes are also shown for comparison.

The Voc data is provided in FIG. 13 for various metal(acac) compounds which suggest that this compound is ideal for high performance solar cells. Of course, other metal (acac) compounds are also possible. In addition, an inert polymer (a surfactant) was used in mixing with a Ca(acac)2 compound.

Enhancement of $V_{OC}$ by Tandem Type Multiple Polymer Solar Cells

Though the efficiency of single layer cells may be improved to 5% or greater as discussed previously, there are several limitations that must be overcome to obtain solar cells with efficiencies over 10%, which is a common milestone necessary for a commercially viable device. The second approach to reach high performance (>10%) solar cells is the enhancement of $V_{OC}$ by stacking multi-cell PV cells. Some successful attempts to increase $V_{OC}$ have been made by using stacked photovoltaic cells. M. Hiramoto, M. Suezaki, and M. Yokoyama, Chem. Lett. 1990, 327 (1990). first applied this idea to a small-molecule organic heterojunction similar to that first described by Tang. The $V_{OC}$ of a cell can be twice that for a single layer device by stacking two identical PV cells. However, to avoid a reversed p-n junction an Ohmic contact was formed between the cells by the evaporation of a thin metal layer which further attenuates light in the back cell, farthest from the side of incident light, and therefore limits $J_{SC}$ in the device. The optimized stacked cell device had a lower efficiency than the single layer device. Later Yakimov and Forrest performed a similar experiment using an ultrathin metal layer 5 Angstroms thick and increased the efficiency from 1% for the single layer device to 2.5% for the optimized two-cell stack. A. Yakimov and S. R. Forrest, Appl. Phys. Lett. 80, 1667 (2002). Stacks of three or more identical cells resulted in lower efficiencies. This is due to the fact that $J_{SC}$ of the stack is that of the single cell with the lowest $J_{SC}$, which becomes lower in the back cell as more cells are added due to light absorption.

One way to circumvent this problem is to create a stacked device where the individual layers have different band gaps. Another new idea we demonstrated is to use PV cells with different bandgap polymer layers to cover an extended region up to substantially the whole solar spectrum. A schematic of this device is shown in FIGS. 14a-14c. The first PV cell, having the highest band gap, is placed near the front of the device. Though a large portion of the incident light will be absorbed for photon energies above the band gap, light that is not collected in the first PV cell may be collected in the second PV cell. For the devices by Hiramoto and Yakimov, this would result in a very low $J_{SC}$ in the back cell and thus the overall device. However, by employing a lower band gap material for the second PV cell, longer wavelength light that passes through the front cell can be absorbed, which would greatly enhance $J_{SC}$ in the back cell and the entire stack. This method can be repeated for additional layers, each with decreasing band gap to compensate for absorption in the preceding layers. This technique will allow $V_{OC}$ to be increased significantly while retaining a large $J_{SC}$. By incorporating individual PV cells with efficiencies of up to 5% into a stacked PV device, overall efficiencies of 10% or greater can be obtained.

One of the largest limiting factors for organic solids is that the band gap is typically around 2 eV, thus sampling only a small part of the solar spectrum. Recently however, groups have begun to report the use polymers with band gaps of between 1.2 eV and 1.8 eV. A copolymer of alternating electron-rich and electron-deficient monomer units was also synthesized with a band gap of 1.6 eV. Unfortunately both types of polymer possessed low molecular weight and formed poor films by spin-coating. Higher molecular weight species of these polymers are likely to form better films and may have even smaller band gaps.

One challenge in creating such a device by solution processing is that the bottom layer may also be soluble in the solvent used for the second layer, which will degrade the first film upon spin coating of the second. However, laminated heterojunction polymer PV devices have been fabricated, and we have previously demonstrated very high-efficiency laminated polymer LEDs using a template activated surface (TAS) process ideal for reel to reel fabrication. One can use these previously developed processes to fabricate multi-cell polymer solar cells using low-cost large-area coating technology. Integration of all aspects of this aspect of the invention can greatly reduce the cost of solar energy.

Vertical Stacking Solar Cells in Parallel or Series Connections

One of the problems of forming the above tandem solar cell is the upper polymer may dissolve the bottom polymer during the wet coating process. One approach to avoid the solvent-dissolving problem is to fabricate individual devices and stack them together. We have successfully demonstrated this concept.

The devices shown in FIG. 15 are two or more devices stacked up and connected in series. Unlike the previous example, each layer of the device has its own substrate. Such a device has shown very high efficiency. (See Table 1 below). The devices shown in different layers can be materials with different bandgaps.

TABLE 1

The comparison of device parameters of PV1 and PV2 in individual, series and parallel connection. The devices in series and parallel connection shown much higher efficiency than the individual photo cells.

| Device | QE (%) | Voc (V) | Isc (mA/cm2) | Vm (V) | Im (mA/cm2) | FF |
|---|---|---|---|---|---|---|
| PV1 | 1.07 | 0.84 | 2.758 | 0.58 | 1.850 | 0.46 |
| PV2 | 1.25 | 0.85 | 3.192 | 0.60 | 2.083 | 0.46 |
| PV1 + PV2 (Series) | 2.57 | 1.65 | 3.400 | 1.16 | 2.217 | 0.46 |
| PV1 + PV2 (Parallel) | 2.78 | 0.85 | 6.842 | 0.62 | 4.483 | 0.48 |

This approach opens a whole new direction to future ultra-high performance polymer solar cells.

Transparent Cathode for Solar Cells and Polymer LEDs

Figure 18:
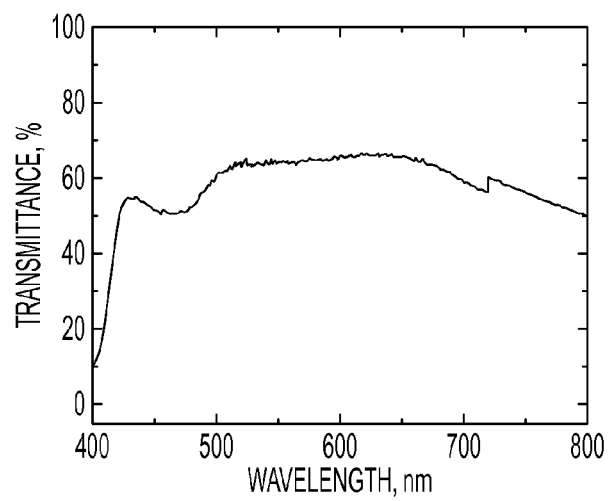
FIG. 18 shows the transparency of the device of FIG. 17.

Due to the need in both displays and solar cells, transparent electrodes, particularly the cathode, are very important. From the metal(acac)$_x$ described in (a), we have developed transparent cathodes that may be used in solar cells and polymer LEDs according to this embodiment of the invention. FIG. 17 shows Au used as a semitransparent cathode, when combining with Ba(acac)2. A thin layer of A (5 Å) has proven to be useful to improve the device efficiency. ITO or other transparent metal oxide can be used as the top conductor to replace Au such that a device with high Voc and truly transparent can be realized. This transparent cathode is well-suited for use in stacking devices. FIG. 18 shows the transparency of the whole device, which demonstrates that the cathode is semi-transparent.

In addition, stacked electrodes according to this invention may be used for the electrodes of the stacked solar cells. For example, Au/Al/Au cathodes as discussed in previous examples may also be suitable for the stacked laminated, series connected or parallel connected solar cells according to this invention. However, this aspect of the invention is not limited to only Au/Al/Au stacked electrodes.

Novel Polymer Devices

In this section, we describe a new concept to form novel organic electronic devices: the Combinational Devices. This concept is simple and yet very powerful. It allows one to form multifunctional organic devices by combining existing organic devices. To illustrate this concept, we demonstrate photo-induced memory devices, which combine the PV cells with our organic memory device.

Figure 19:
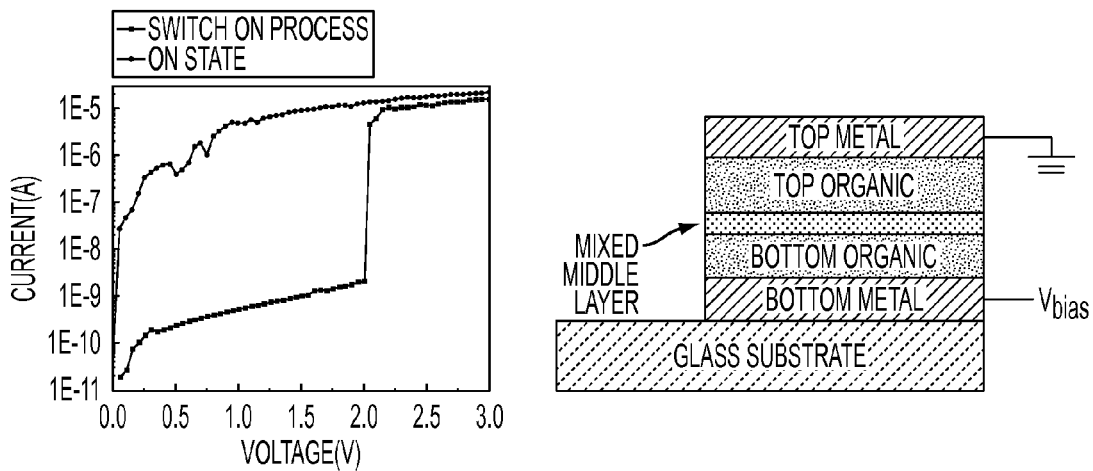
FIG. 19 shows I-V curves and a schematic of the structure of an OBD according to an embodiment of this invention.

We have previously inverted a novel organic bistable device (OBD) and its electrical switching and memory effect. See, L. P. Ma, J. Liu, and Y. Yang, Appl. Phys. Lett. 80, 2997 (2002), the entire contents of which are incorporated herein by reference. The device in this example has five thin films: an organic/metal/organic triple layer sandwiched between two metal electrodes (FIG. 19). When the applied bias on the device is above a critical voltage, the device switches from a high impedance state (OFF state) to a low impedance state (ON state) and remains in the ON state. The ON state and OFF state of an OBD can be precisely controlled by the application of a positive voltage to write or a negative voltage to erase. Recently, we used a mixed metal and organic layer formed by co-evaporation to replace the middle metal layer and found that the performance and yield of the devices improved. The structure of the OBD and its typical I-V curves are shown in FIG. 19. During the first bias scan, the device shows a very low current in the low-voltage range, indicating the device is in the OFF state. However, when the bias reaches a critical voltage of 2.1 V, the current sharply increases by more than three orders of magnitude, indicating that the device has been switched from the OFF state to the ON state. The device shows a very high current while the bias voltage increases. The I-V curve recorded in the second bias scan is totally different from the first. The device shows very high current during the second bias, indicating that the device remained in the ON state. The device remains in the low impendence state even when no bias is applied until erased by the application of a negative voltage. Moreover, the switching and memory effect of the OBD is repeatable. These unique properties indicate that the OBD can be used as a nonvolatile memory device.

A photovoltaic cell and OBD can be combined to form a photovoltaic OBD (PVOBD), which can be used as (a) an optical switch and (b) an optically induced memory device.

Figure 20A:
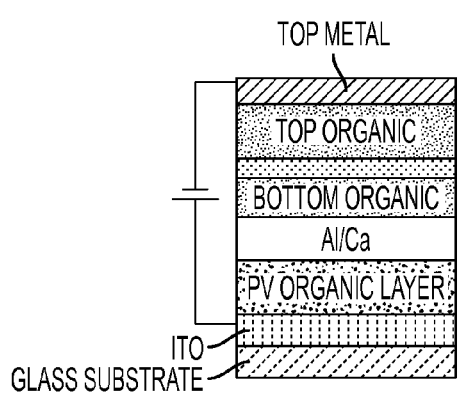
FIG. 20a is a schematic illustration of the structure of a PVOBD according to an embodiment of this invention.
Figure 20B:
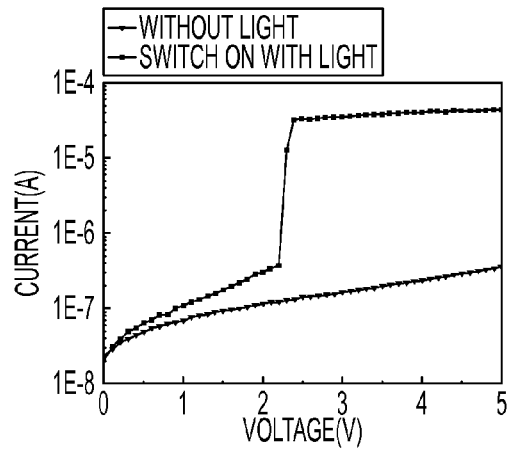

The structure and I-V curves of a PVOBD are shown in FIGS. 20a and 20b. The top electrode of the photovoltaic cell is Al. The OBD device was fabricated layer-by-layer directly on the PV device. From FIG. 20b, we can see that the device does not show switching behavior in the dark and stays in the OFF state. However, under illumination through the ITO electrode, the device switches from the OFF state to the ON state when a 2.2 V bias is applied, and then remains in the ON state. From these I-V curves, one can see that the PVOBD can be used as an optical memory switch. In the dark, the device will stay in OFF state even while biased over the critical voltage until a photon triggers switching to the ON state.

Figure 20C:
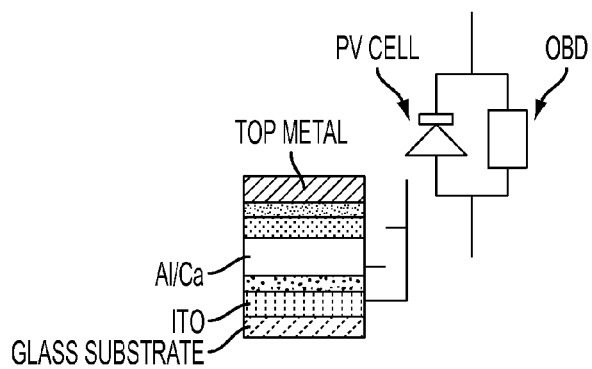
FIG. 20c is a schematic illustration of a parallel connection of the PVOBD according to an embodiment of this invention.

One can connect the photovoltaic cell and OBD in parallel (FIG. 20c), to provide a photo-switch. In the dark, both the resistance of the photovoltaic cell and OBD are large, i.e. the switch is off. Under illumination, the PV cell will switch the OBD to the low impedance ON state. The parallel resistance of the PV and OBD will be small and the optical switch will be on. Even after the light is gone, the OBD remains in the ON state and the switch will be on until a negative voltage is applied and the OBD is switched to the OFF state, turning the optical switch off simultaneously. Because the $V_{OC}$ of a single PV cell is too small, our stacked polymer PV cell will be useful to provide large $V_{OC}$ for this application. Alternatively, several cells in series of a multi-cell PV device could be used.

Figure 21A:
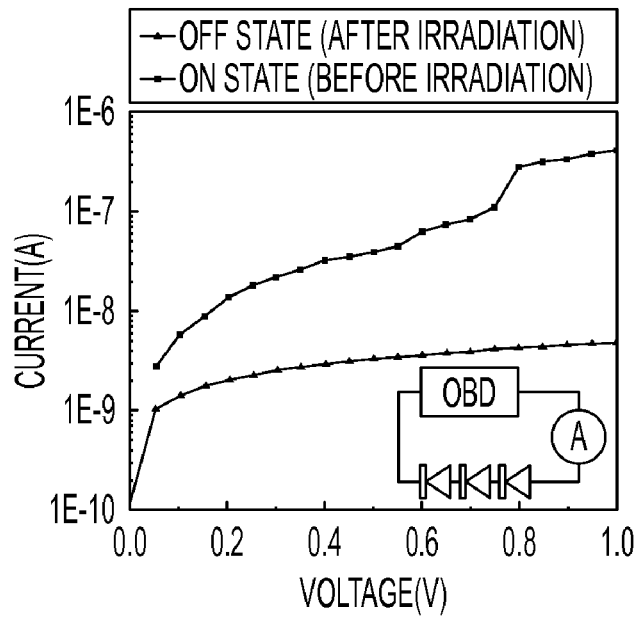
Figure 21B:
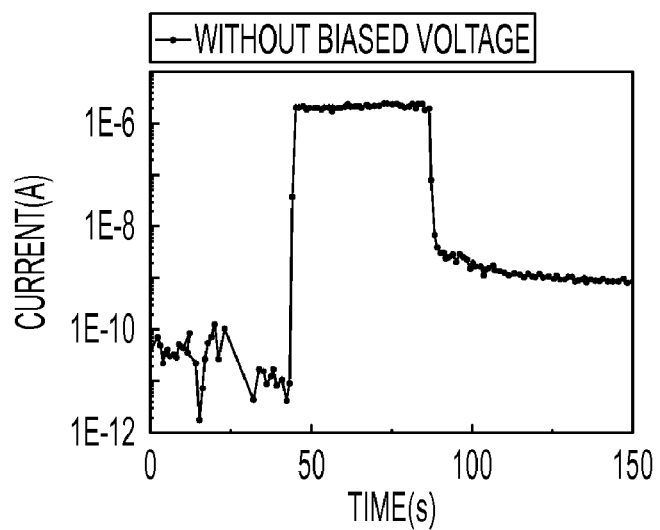

The photo-induced memory effect of PVOBD has also been demonstrated. As shown in FIG. 21a, three PV cells and one OBD were connected in series. The current through the circuit with and without light was then measured. The I-V curve of the device is shown in FIG. 21b. Before illumination, the current going through the devices is very small, which means the devices in series have high impedance. However, after illumination the current increases about two orders of magnitude and remains even when the light is gone. The current before and after illumination is shown in FIG. 21a as a function of time. The current is very low before exposure to light, and becomes high under illumination. After the light is removed, the current is one order of magnitude higher than before irradiation. (There is a low current without irradiation of light because there is background light, so the photovoltaic cells generate a voltage and a current through OBD and PV cells). From FIG. 21b, we can see that the PVOBD switches from the OFF state to the ON state and stays in the ON state. Upon a negative bias, the OBD can be switched off. The PVOBD is ideal for light detection and also has a memory effect. This behavior can be applied in photo-memory devices, such as charge coupling devices.

Because the turn-on voltage of OBD is about 2.2 V, an additional voltage is required to turn on the OBD. We connect three PV cells in series to have enough driving voltage. In the future, a stacked multi-cell PV with higher $V_{OC}$ could be used to decrease the effective switching voltage of the OBD.

In order to achieve gray-scale, a sufficiently high $V_{OC}$ from a polymer PV cell is needed, and the dynamic range of such device is also very important. For this project, we will apply our high $V_{OC}$ device to the OBD.

Other combinations within the general concepts of this invention are also possible. For example, semi-transparent or non-transparent solar cells according to the current invention may be used on or as parts of windows and/or window blinds to generate electric power. In addition, they can also be used as backup power devices for portable electronics, such as cell phones, PDAs, music players, or for automobiles.

The embodiments illustrated and discussed in this specification are intended only to teach those skilled in the art the best way known to the inventors to make and use the invention. Nothing in this specification should be considered as limiting the scope of the present invention. The above-described embodiments of the invention may be modified or varied, and elements added or omitted, without departing from the invention, as appreciated by those skilled in the art in light of the above teachings. It is therefore to be understood that, within the scope of the claims and their equivalents, the invention may be practiced otherwise than as specifically described.

We claim:

1. An electrode for an electro-optic device, comprising:
   a wetting layer of electrically conductive material formed on a substrate; and
   a second layer of electrically conductive material formed on said wetting layer of electrically conductive material,
   wherein said wetting layer has a first wetting ability with respect to a surface of said substrate and said second layer has a second wetting ability with respect to said surface of said substrate, said first wetting ability being different from said second wetting ability, and
   wherein said wetting layer acts to alter an optical property of said electrode due to its wetting ability on said surface of said substrate.

2. An electrode for an electro-optic device according to claim 1, wherein said first wetting ability of said wetting layer is greater than said second wetting ability of said second layer.

3. An electrode for an electro-optic device according to claim 2, wherein said wetting layer acts to increase an optical transmittance of said electrode.

4. An electrode for an electro-optic device according to claim 3, further comprising a third layer of electrically conductive material formed on said second layer of electrically conductive material.

5. An electrode for an electro-optic device according to claim 4, wherein said wetting layer has a thickness in a range from about 0.2 nm to 0.5 nm.

6. An electrode for an electro-optic device according to claim 5, wherein said wetting layer has a thickness of about 0.25 nm.

7. An electrode for an electro-optic device according to claim 5, wherein said second layer of electrically conductive material has a thickness in a range from about 2.0 nm to 4.0 nm.

8. An electrode for an electro-optic device according to claim 7, wherein said third layer of electrically conductive material has a thickness in a range from about 9.0 nm to 11.0 nm.

9. An electrode for an electro-optic device according to claim 8, wherein said wetting layer consists essentially of Au, said second layer consists essentially of Al and said third layer consists essentially of Au.

10. An electrode for an electro-optic device according to claim 7, wherein said third layer of electrically conductive material has a thickness in a range from about 8.0 nm to 11.0 nm.

11. An electrode for an electro-optic device according to claim 10, wherein said wetting layer consists essentially of Cu, said second layer consists essentially of Al, and said third layer consists essentially of Cu.

12. An electrode for an electro-optic device according to claim 4, wherein said wetting layer consists essentially of a metal and has a thickness less than a corresponding skin depth, said second layer consists essentially of a metal and has a thickness less than a corresponding skin depth, and said third layer consists essentially of a metal and has a thickness less than a corresponding skin depth.

13. An electrode for an electro-optic device according to claim 4, wherein said wetting layer, said second layer, and said third layer of electrically conductive material are each formed by a deposition process.

14. An electrode for an electro-optic device according to claim 2, wherein said wetting layer acts to increase an optical absorption of said electrode.

15. An electrode for an electro-optic device according to claim 14, wherein said wetting layer of electrically conductive material comprises nano-clusters comprising said electrically conductive material of said wetting layer.

16. An electrode for an electro-optic device according to claim 15, wherein said second layer of electrically conductive material consists essentially of Ag.

17. An electrode for an electro-optic device according to claim 14, wherein said wetting layer of electrically conductive material comprise Al.

18. An electrode for an electro-optic device according to claim 1, wherein said first wetting ability of said wetting layer is less than said second wetting ability of said second layer.

19. An electro-optic device, comprising:
a substrate; and
a stacked layer electrode formed on said substrate,
wherein said stacked layer substrate comprises:
a wetting layer of electrically conductive material formed on a substrate; and
a second layer of electrically conductive material formed on said wetting layer of electrically conductive material,
wherein said wetting layer has a first wetting ability with respect to a surface of said substrate and said second layer has a second wetting ability with respect to said surface of said substrate, said first wetting ability being different from said second wetting ability, and
wherein said wetting layer acts to alter an optical property of said electrode due to the wetting ability of said wetting layer on said surface of said substrate.

20. An electro-optic device according to claim 19, wherein said first wetting ability of said wetting layer is greater than said second wetting ability of said second layer.

21. An electro-optic device according to claim 20, wherein said wetting layer acts to increase an optical transmittance of said electrode.

22. An electro-optic device according to claim 21, further comprising a third layer of electrically conductive material formed on said second layer of electrically conductive material.

23. An electro-optic device according to claim 22, wherein said wetting layer has a thickness in a range from about 0.2 nm to 0.5 nm.

24. An electro-optic device according to claim 23, wherein said wetting layer has a thickness of about 0.25 nm.

25. An electro-optic device according to claim 23, wherein said second layer of electrically conductive material has a thickness in a range from about 2.0 nm to 4.0 nm.

26. An electro-optic device according to claim 25, wherein said third layer of electrically conductive material has a thickness in a range from about 9.0 nm to 11.0 nm.

27. An electro-optic device according to claim 26, wherein said wetting layer consists essentially of Au, said second layer consists essentially of Al and said third layer consists essentially of Au.

28. An electro-optic device according to claim 25, wherein said third layer of electrically conductive material has a thickness in a range from about 8.0 nm to 11.0 nm.

29. An electro-optic device according to claim 28, wherein said wetting layer consists essentially of Cu, said second layer consists essentially of Al, and said third layer consists essentially of Cu.

30. An electro-optic device according to claim 22, wherein said wetting layer consists essentially of a metal and has a thickness less than a corresponding skin depth, said second layer consists essentially of a metal and has a thickness less than a corresponding skin depth, and said third layer consists essentially of a metal and has a thickness less than a corresponding skin depth.

31. An electro-optic device according to claim 22, wherein said wetting layer, said second layer, and said third layer of electrically conductive material are each formed by a deposition process.

32. An electro-optic device according to claim 20, wherein said wetting layer acts to increase an optical absorption of said electrode.

33. An electro-optic device according to claim 32, wherein said wetting layer of electrically conductive material comprises nano-clusters comprising said electrically conductive material of said wetting layer.

34. An electro-optic device according to claim 32, wherein said wetting layer of electrically conductive material comprise Al.

35. An electro-optic device according to claim 34, wherein said second layer of electrically conductive material consists essentially of Ag.

36. An electro-optic device according to claim 19, wherein said first wetting ability of said wetting layer is less than said second wetting ability of said second layer.

37. An electro-optic device according to claim 19, wherein said substrate comprises an ITO/glass layer, an organic layer formed on said ITO/glass layer, and an M(acac)$_2$ layer formed on said organic layer, said electro-optic device being a polymeric light emitting diode.

38. An electro-optic device according to claim 19, wherein said substrate comprises a plastic substrate, a transparent electrode formed on said plastic substrate, and a plurality of tandem photovoltaic cells formed on said transparent electrode; said electro-optic device being a tandem stacked multiple polymer solar cell.

39. An electro-optic device according to claim 19, wherein said substrate comprises a glass substrate and polymer photovoltaic cell formed on said glass substrate, said electro-optic device being a solar cell adapted to be electrically connected to another solar cell at least in one of a series or a parallel circuit to provide a vertical stacking of solar cells.

* * * * *